US011847557B2

(12) United States Patent
Tran et al.

(10) Patent No.: US 11,847,557 B2
(45) Date of Patent: *Dec. 19, 2023

(54) COMPENSATION FOR REFERENCE TRANSISTORS AND MEMORY CELLS IN ANALOG NEURO MEMORY IN DEEP LEARNING ARTIFICIAL NEURAL NETWORK

(71) Applicant: Silicon Storage Technology, Inc., San Jose, CA (US)

(72) Inventors: Hieu Van Tran, San Jose, CA (US); Vipin Tiwari, Dublin, CA (US); Nhan Do, Saratoga, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/885,437

(22) Filed: Aug. 10, 2022

(65) Prior Publication Data

US 2022/0383087 A1    Dec. 1, 2022

Related U.S. Application Data

(62) Division of application No. 16/150,606, filed on Oct. 3, 2018, now Pat. No. 11,443,175.

(Continued)

(51) Int. Cl.
*G11C 11/56*    (2006.01)
*G06N 3/065*    (2023.01)
(Continued)

(52) U.S. Cl.
CPC ............. *G06N 3/065* (2023.01); *G06F 3/061* (2013.01); *G06F 3/0688* (2013.01); *G06F 17/16* (2013.01);
(Continued)

(58) Field of Classification Search
CPC .......... G06N 3/065; G06N 3/048; G06N 3/08; G06N 3/045; G06N 3/044; G06F 3/061;
(Continued)

(56) References Cited

U.S. PATENT DOCUMENTS

| 5,256,911 A | 10/1993 | Holler |
| 6,282,145 B1 | 8/2001 | Tran |

(Continued)

FOREIGN PATENT DOCUMENTS

| JP | 2007-59024 | 3/2007 |
| JP | 2019-517138 | 6/2019 |

(Continued)

OTHER PUBLICATIONS

Notice of Reasons for Refusal dated Dec. 22, 2022 corresponding to the related Japanese Patent Application No. 2021-500631. (English translations).

(Continued)

*Primary Examiner* — Jerome Leboeuf
(74) *Attorney, Agent, or Firm* — DLA PIPER LLP US

(57) ABSTRACT

Numerous embodiments are disclosed for compensating for differences in the slope of the current-voltage characteristic curve among reference transistors, reference memory cells, and flash memory cells during a read operation in an analog neural memory in a deep learning artificial neural network. In one embodiment, a method comprises receiving an input voltage, multiplying the input voltage by a coefficient to generate an output voltage, applying the output voltage to a gate of a selected memory cell, performing a sense operating using the selected memory cell and a reference device to determine a value stored in the selected memory cell, wherein a slope of a current-voltage characteristic curve of the reference device and a slope of the current-voltage (Continued)

characteristic curve of the selected memory cell are approximately equal during the sense operation.

22 Claims, 37 Drawing Sheets

Related U.S. Application Data

(60) Provisional application No. 62/696,718, filed on Jul. 11, 2018.

(51) Int. Cl.
| | |
|---|---|
| *G06F 3/06* | (2006.01) |
| *G06F 17/16* | (2006.01) |
| *G06N 3/08* | (2023.01) |
| *G11C 13/00* | (2006.01) |
| *G11C 16/04* | (2006.01) |
| *G11C 16/28* | (2006.01) |
| *G06N 3/048* | (2023.01) |

(52) U.S. Cl.
CPC ............. *G06N 3/048* (2023.01); *G06N 3/08* (2013.01); *G11C 11/5642* (2013.01); *G11C 13/004* (2013.01); *G11C 16/0425* (2013.01); *G11C 16/28* (2013.01); *G11C 2211/563* (2013.01); *G11C 2213/15* (2013.01)

(58) Field of Classification Search
CPC ... G06F 3/0688; G06F 17/16; G11C 11/5642; G11C 13/004; G11C 16/0425; G11C 16/28; G11C 2211/563; G11C 2213/15; G11C 11/54
See application file for complete search history.

(56) References Cited

U.S. PATENT DOCUMENTS

| | | | |
|---|---|---|---|
| 6,324,098 B1 * | 11/2001 | Condemi | G11C 16/28 |
| | | | 365/185.21 |
| 11,443,175 B2 * | 9/2022 | Tran | G11C 16/0425 |
| 2004/0084727 A1 | 5/2004 | Ueda | |
| 2005/0088863 A1 | 4/2005 | Pearce | |
| 2017/0337466 A1 | 11/2017 | Bayat et al. | |
| 2019/0213234 A1 | 7/2019 | Bayat | |
| 2019/0332929 A1 | 10/2019 | Schie | |

FOREIGN PATENT DOCUMENTS

| | | |
|---|---|---|
| KR | 2017 0025621 | 3/2017 |
| WO | 2004/077439 | 9/2004 |
| WO | 2017-200883 | 11/2017 |

OTHER PUBLICATIONS

Extended European Search Report dated Jan. 16, 2023 corresponding to the related European Patent Application No. 22199119.3.

* cited by examiner

FIGURE 11

| | WL | WL_unsel | BL | BL_unsel | SL | SL_unsel |
|---|---|---|---|---|---|---|
| Read | 1-3.5V | -0.5V/0V | 0.6-2V (Ineuron) | 0.6V-2V/0V | 0V | 0V |
| Erase | ~5-13V | 0V | 0V | 0V | 0V | 0V |
| Program | 1-2V | -0.5V/0V | 0.1-3 uA | Vinh ~2.5V | 4-10V | 0-1V/FLT |

FIGURE 13

| | WL | WL-unsel | BL | BL-unsel | SL | SL-unsel |
|---|---|---|---|---|---|---|
| Read | 1-3.5V | -0.5V/0V | 0.6-2V | 0.6V-2V/0V | ~0.3-1V (Ineuron) | 0V |
| Erase | ~5-13V | 0V | 0V | 0V | 0V | SL-inhibit (~4-8V) |
| Program | 1-2V | -0.5V/0V | 0.1-3 uA | Vinh ~2.5V | 4-10V | 0-1V/FLT |

FIGURE 15

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2V | -0.5V/ 0V | 0.6-2V (Ineuron) | 0V | 0-2.6V | 0-2.6V | 0-2.6V | 0-2.6V | 0-2.6V | 0V | 0V |
| Erase | 0V | 0V | 0V | 0V | 0V | 0-2.6V | 0-2.6V | 5-12V | 0-2.6V | 0V | 0V |
| Program | 0.7-1V | -0.5V/ 0V | 0.1-1uA | Vinh (1-2V) | 4-11V | 0-2.6V | 0-2.6V | 4.5-5V | 0-2.6V | 4.5-5V | 0-1V |

FIGURE 17

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2V | -0.5V/ 0V | 0.6-2V (1neuron) | 0V | 0-2.6V | 0-2.6V | 0-2.6V | 0-2.6V | 0-2.6V | 0V | 0V |
| Erase | 0V | 0V | 0V | 0V | 0V | CGINH (4-9V) | 0-2.6V | 5-12V | 0-2.6V | 0V | 0V |
| Program | 0.7-1V | -0.5V/ 0V | 0.1-1uA | Vinh (1-2V) | 4-11V | 0-2.6V | 0-2.6V | 4.5-5V | 0-2.6V | 4.5-5V | 0-1V |

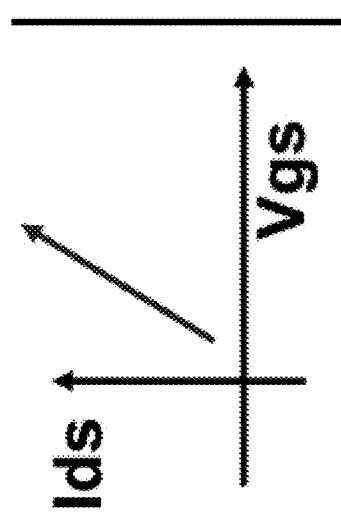
FIGURE 18A
1801
FIGURE 18B
1802
FIGURE 18C
1803
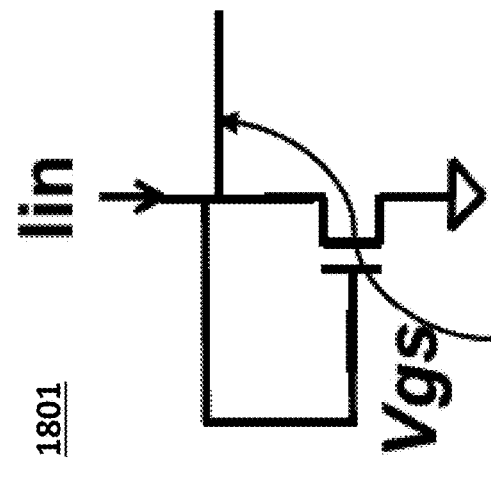
FIGURE 18D
1804
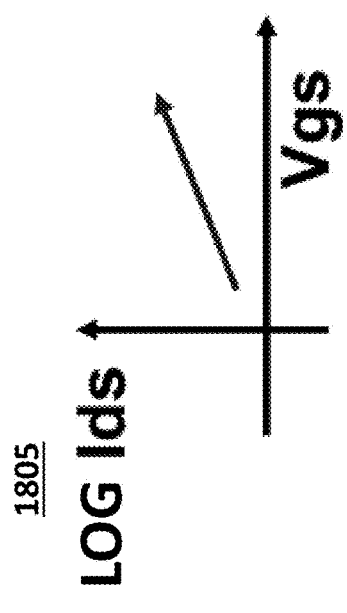
FIGURE 18E
1805
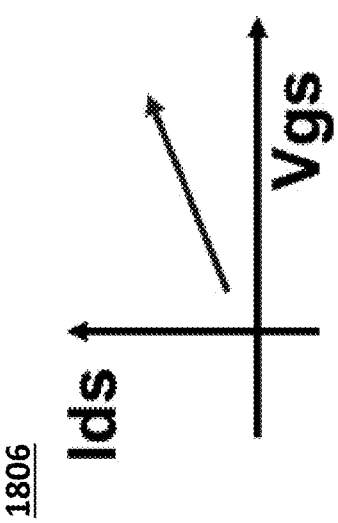
FIGURE 18F
1806

COMPENSATION FOR REFERENCE TRANSISTORS AND MEMORY CELLS IN ANALOG NEURO MEMORY IN DEEP LEARNING ARTIFICIAL NEURAL NETWORK

PRIORITY CLAIM

This application is a divisional application of U.S. patent application Ser. No. 16/150,606, filed on Oct. 3, 2018, and titled, "Compensation for Reference Transistors and Memory Cells in Analog Neuro Memory in Deep Learning Artificial Neural Network," which claims priority to U.S. Provisional Patent Application No. 62/696,718, filed on Jul. 11, 2018, and titled, "Compensation for Reference Transistors and Memory Cells in Analog Neuro Memory in Deep Learning Artificial Neural Network," which are incorporated by reference herein.

FIELD OF THE INVENTION

Numerous embodiments are disclosed for compensating for differences in the slope of the current-voltage characteristic curve among reference transistors, reference memory cells, and flash memory cells during a read operation in an analog neural memory in a deep learning artificial neural network.

BACKGROUND OF THE INVENTION

Artificial neural networks mimic biological neural networks (e.g., the central nervous systems of animals, in particular the brain) which are used to estimate or approximate functions that can depend on a large number of inputs and are generally unknown. Artificial neural networks generally include layers of interconnected "neurons" which exchange messages between each other.

FIG. 1 illustrates an artificial neural network 100, where the circles represent the inputs or layers of neurons. The connections (called synapses) are represented by arrows, and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, which is incorporated by reference. The non-volatile memory arrays operate as analog neuromorphic memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs.

Each non-volatile memory cells used in the analog neuromorphic memory system must be erased and programmed to hold a very specific and precise amount of charge in the floating gate. For example, each floating gate must hold one of N different values, where N is the number of different weights that can be indicated by each cell. Examples of N include 16, 32, and 64.

One unique characteristic of analog neuromorphic memory systems is that the system must support two different types of read operations. In a normal read operation, an individual memory cell is read as in conventional memory systems. However, in a neural read operation, the entire array of memory cells is read at one time, where each bit line will output a current that is the sum of all currents from the memory cells connected to that bit line.

As a result, analog neuromorphic memory systems are very sensitive to mismatching between memory cells and transistors. Extreme accuracy is required, and if two devices have different current-voltage characteristic curves, then the system will be inaccurate.

What is needed is an improved analog neuromorphic memory system that compensates for differences in current-voltage characteristic curves among different memory cells and transistors.

SUMMARY OF THE INVENTION

Numerous embodiments are disclosed for compensating for differences in the slope of the current-voltage characteristic curve among reference transistors, reference memory cells, and flash memory cells during a read operation in an analog neural memory in a deep learning artificial neural network. The embodiments are able to compensate for slope differences during both sub-threshold and linear operation of reference transistors.

BRIEF DESCRIPTION OF THE DRAWINGS

FIG. 11 depicts operating voltages to perform operations on the vector multiplier matrix of FIG. 10.

FIG. 13 depicts operating voltages to perform operations on the vector multiplier matrix of FIG. 12.

FIG. 15 depicts operating voltages to perform operations on the vector multiplier matrix of FIG. 14.

FIG. 17 depicts operating voltages to perform operations on the vector multiplier matrix of FIG. 16.

FIG. 18A depicts a reference transistor.

FIG. 18B depicts a sub-threshold current-voltage characteristic curve for the reference transistor of FIG. 18A.

FIG. 18C depicts a linear current-voltage characteristic curve for the reference transistor of FIG. 18A.

FIG. 18D depicts a memory cell.

FIG. 18E depicts a sub-threshold current-voltage characteristic curve for the memory cell of FIG. 18C.

FIG. 18F depicts a linear current-voltage characteristic curve for the memory cell of FIG. 18D.

DETAILED DESCRIPTION OF THE INVENTION

The artificial neural networks of the present invention utilize a combination of CMOS technology and non-volatile memory arrays.

Non-Volatile Memory Cells

Figure 1:
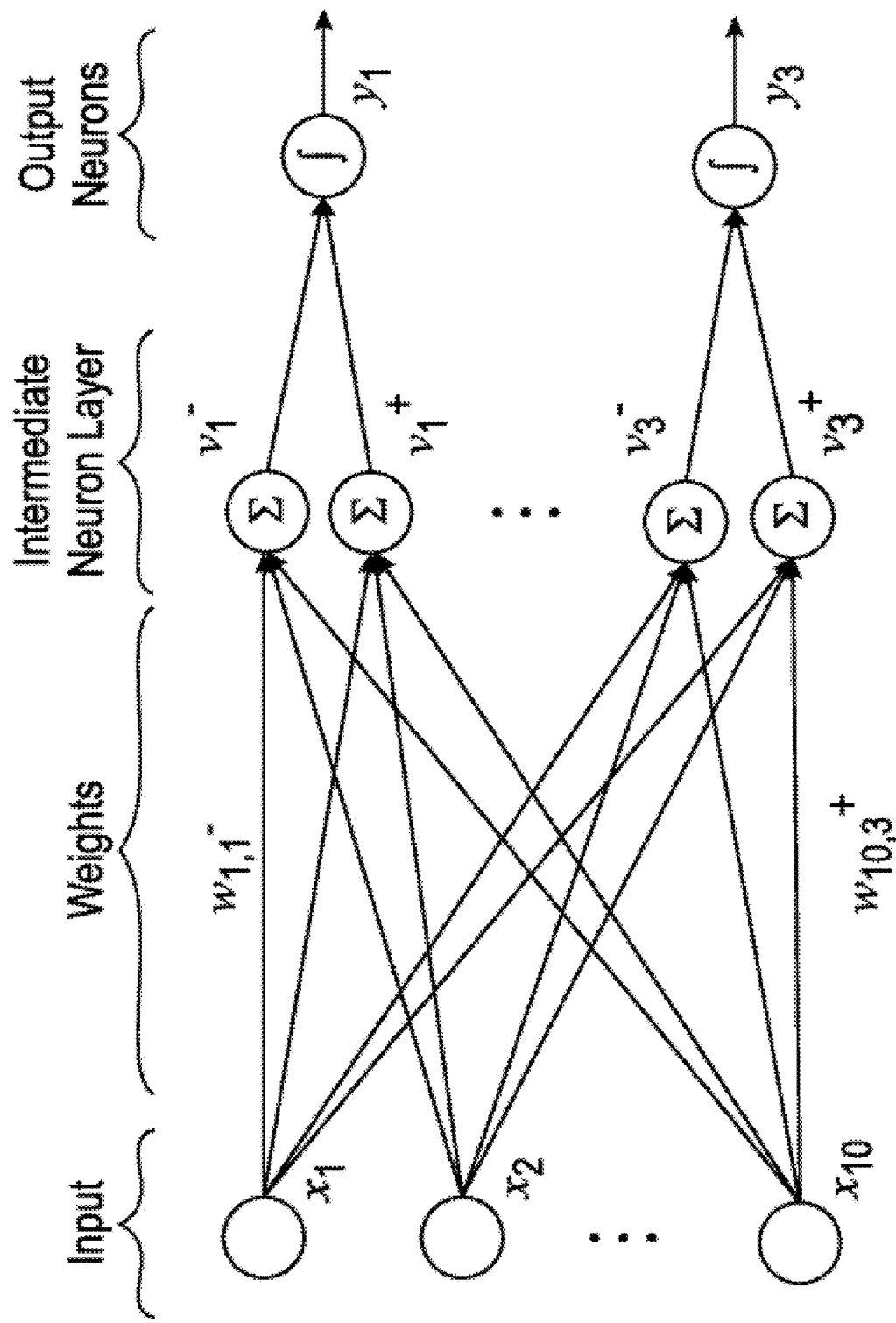
FIG. 1 is a diagram that illustrates a prior art artificial neural network.
Figure 2:
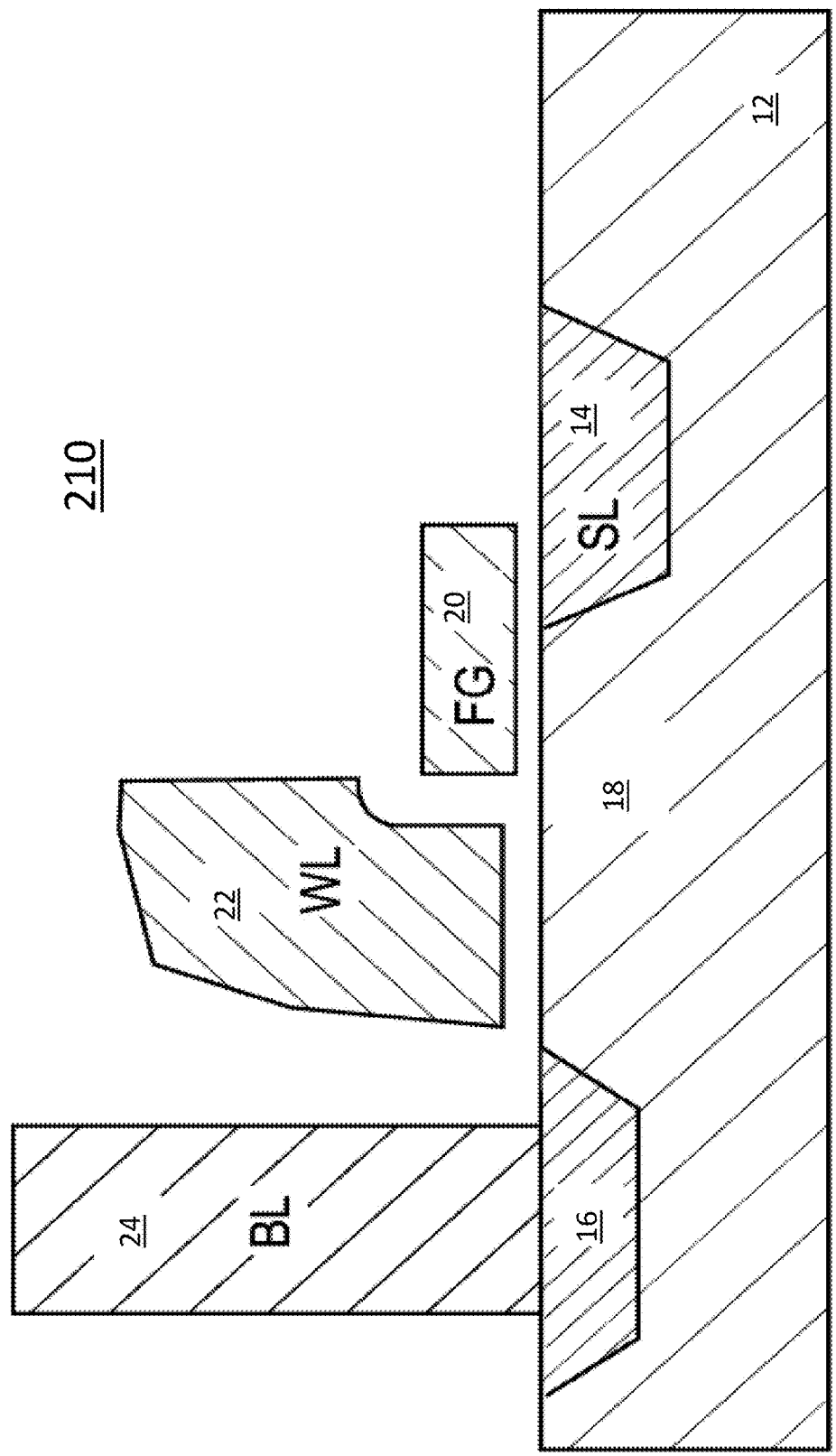
FIG. 2 is a cross-sectional side view of a conventional 2-gate non-volatile memory cell.

Digital non-volatile memories are well known. For example, U.S. Pat. No. 5,029,130 ("the '130 patent") discloses an array of split gate non-volatile memory cells, and is incorporated herein by reference for all purposes. Such a memory cell is shown in FIG. 2. Each memory cell 210 includes source region 14 and drain region 16 formed in a semiconductor substrate 12, with a channel region 18 there between. A floating gate 20 is formed over and insulated from (and controls the conductivity of) a first portion of the channel region 18, and over a portion of the source region 16. A word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source 16. Electron current will flow from the source 16 towards the drain 14. The electrons will accelerate and become heated when they reach the gap between the word line terminal 22 and the floating gate 20. Some of the heated electrons will be injected through the gate oxide 26 onto the floating gate 20 due to the attractive electrostatic force from the floating gate 20.

Memory cell 210 is read by placing positive read voltages on the drain 14 and word line terminal 22 (which turns on the channel region under the word line terminal). If the floating gate 20 is positively charged (i.e. erased of electrons and positively coupled to the drain 16), then the portion of the channel region under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 210 for performing read, erase, and program operations:

TABLE NO. 1

Operation of Flash Memory Cell 210 of FIG. 2

|  | WL | BL | SL |
|---|---|---|---|
| Read | 2-3 V | 0.6-2 V | 0 V |
| Erase | ~11-13 V | 0 V | 0 V |
| Program | 1-2 V | 1-3 µA | 9-10 V |

Figure 3:
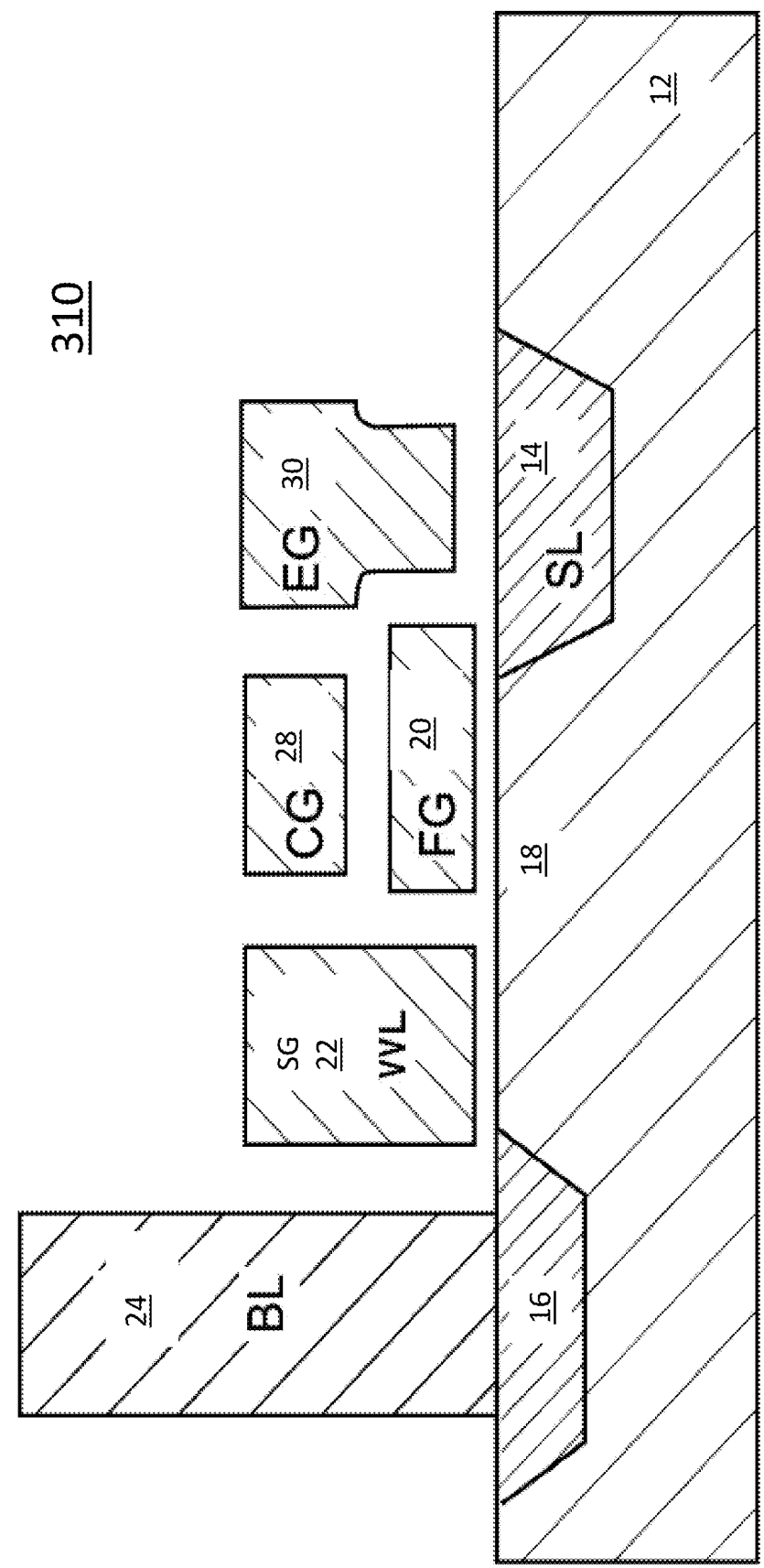
FIG. 3 is a cross-sectional side view of a conventional 4-gate non-volatile memory cell.

Other split gate memory cell configurations are known. For example, FIG. 3 depicts four-gate memory cell 310 comprising source region 14, drain region 16, floating gate 20 over a first portion of channel region 18, a select gate 28 (typically coupled to a word line) over a second portion of the channel region 18, a control gate 22 over the floating gate 20, and an erase gate 30 over the source region 14. This configuration is described in U.S. Pat. No. 6,747,310, which is incorporated herein by reference for all purposes). Here, all gates are non-floating gates except floating gate 20, meaning that they are electrically connected or connectable to a voltage source. Programming is shown by heated electrons from the channel region 18 injecting themselves onto the floating gate 20. Erasing is shown by electrons tunneling from the floating gate 20 to the erase gate 30.

Table No. 2 depicts typical voltage ranges that can be applied to the terminals of memory cell 310 for performing read, erase, and program operations:

TABLE NO. 2

Operation of Flash Memory Cell 310 of FIG. 3

|  | WL/SG | BL | CG | EG | SL |
|---|---|---|---|---|---|
| Read | 1.0-2 V | 0.6-2 V | 0-2.6 V | 0-2.6 V | 0 V |
| Erase | -0.5 V/0 V | 0 V | 0 V/-8 V | 8-12 V | 0 V |
| Program | 1 V | 1 µA | 8-11 V | 4.5-9 V | 4.5-5 V |

Figure 4:
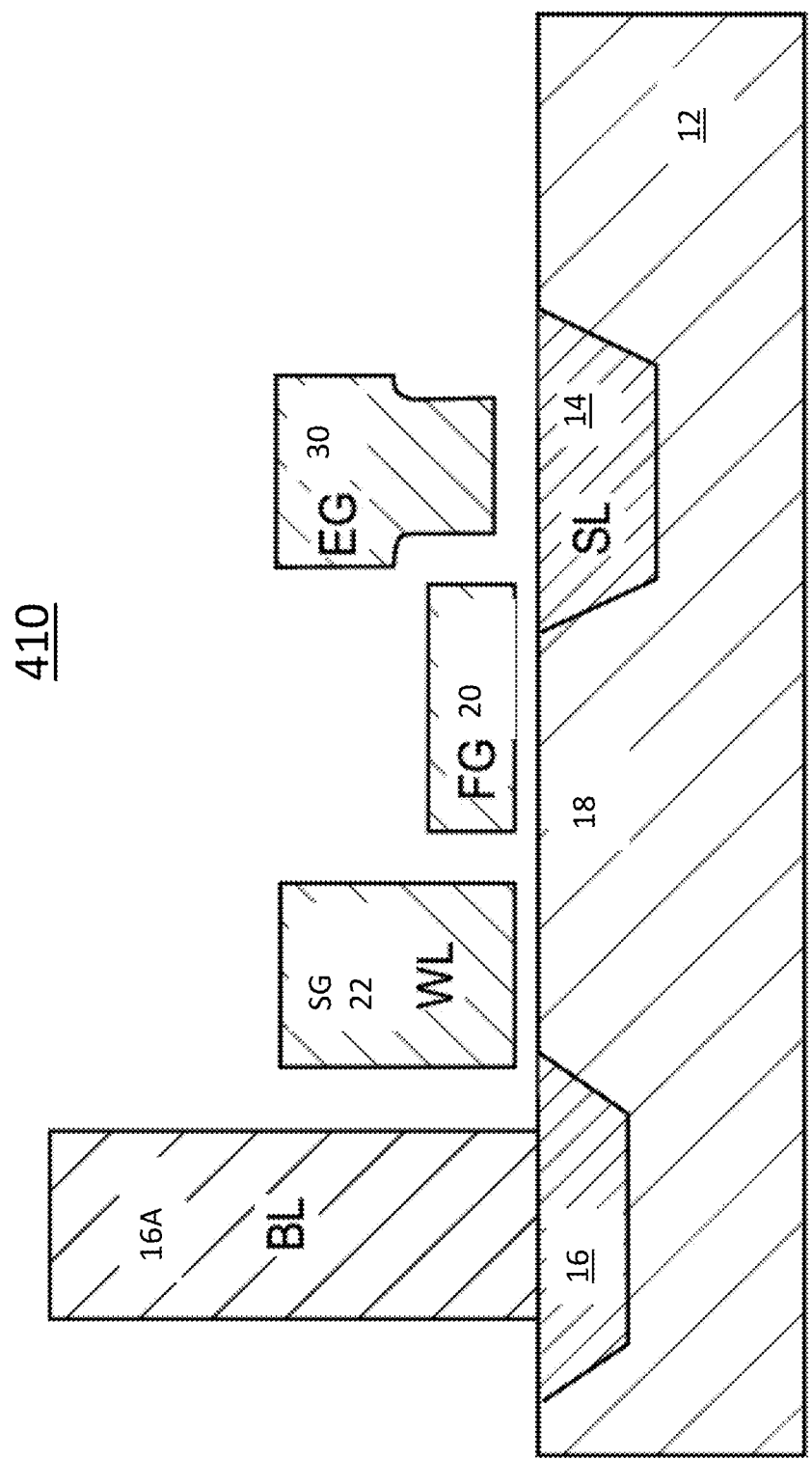
FIG. 4 is a side cross-sectional side view of conventional 3-gate non-volatile memory cell.

FIG. 4 depicts split gate three-gate memory cell 410. Memory cell 410 is identical to the memory cell 310 of FIG. 3 except that memory cell 410 does not have a separate control gate. The erase operation (erasing through erase gate) and read operation are similar to that of the FIG. 3 except there is no control gate bias. The programming operation also is done without the control gate bias, hence the program voltage on the source line is higher to compensate for lack of control gate bias.

Table No. 3 depicts typical voltage ranges that can be applied to the terminals of memory cell 410 for performing read, erase, and program operations:

TABLE NO. 3

Operation of Flash Memory Cell 410 of FIG. 4

|  | WL/SG | BL | EG | SL |
|---|---|---|---|---|
| Read | 0.7-2.2 V | 0.6-2 V | 0-2.6 V | 0 V |
| Erase | -0.5 V/0 V | 0 V | 11.5 V | 0 V |
| Program | 1 V | 2-3 µA | 4.5 V | 7-9 V |

Figure 5:
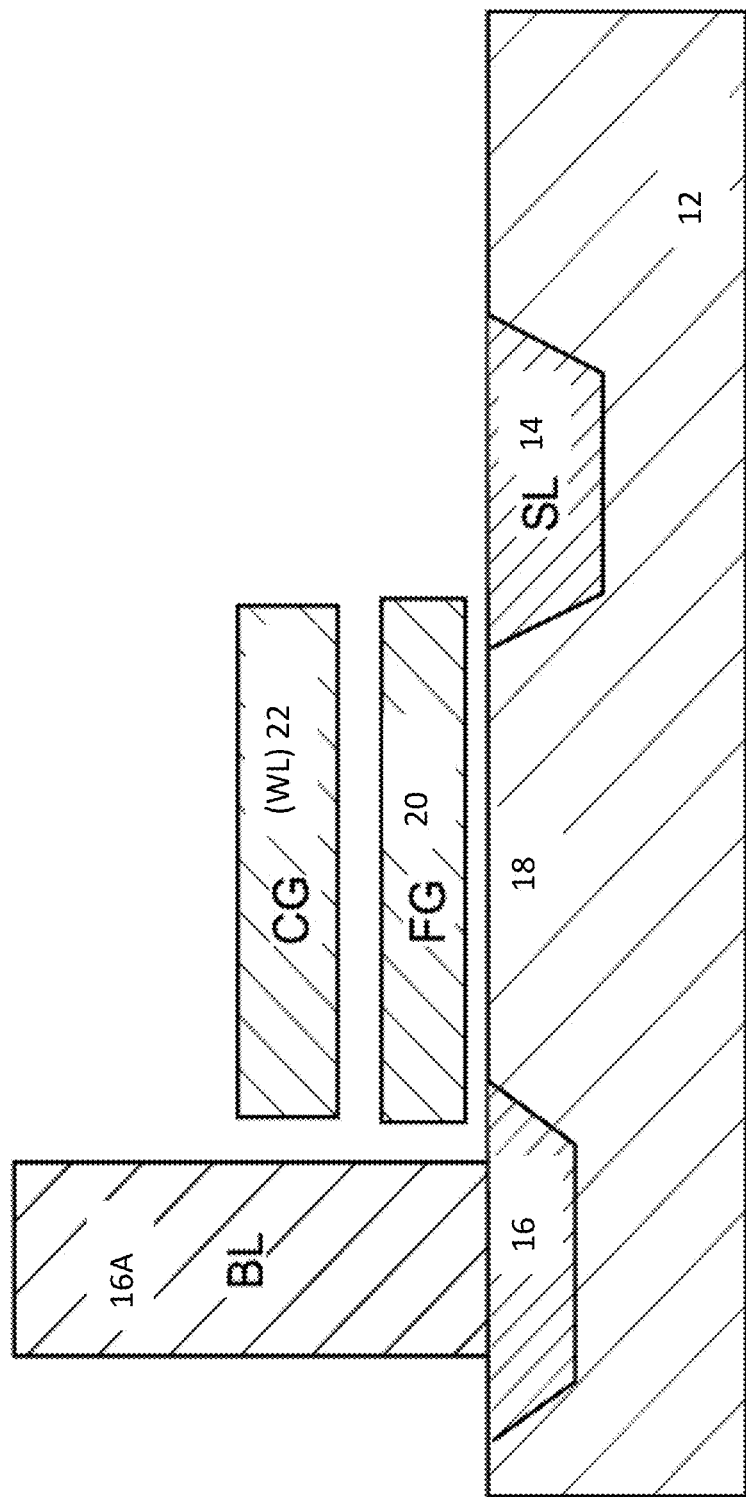
FIG. 5 is a cross-sectional side view of another conventional 2-gate non-volatile memory cell.

FIG. 5 depicts stacked gate memory cell 510. Memory cell 510 is similar to memory cell 210 of FIG. 2, except floating gate 20 extends over the entire channel region 18, and control gate 22 extends over floating gate 20, separated by an insulating layer. The erase, programming, and read operations operate in a similar manner to that described previously for memory cell 210.

Table No. 4 depicts typical voltage ranges that can be applied to the terminals of memory cell 510 for performing read, erase, and program operations:

TABLE NO. 4

Operation of Flash Memory Cell 510 of FIG. 5

|  | CG | BL | SL | P-sub |
|---|---|---|---|---|
| Read | 2-5 V | 0.6-2 V | 0 V | 0 V |
| Erase | -8 to -10 V/0 V | FLT | FLT | 8-10 V/15-20 V |
| Program | 8-12 V | 3-5 V | 0 V | 0 V |

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cells in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

Neural Networks Employing Non-Volatile Memory Cell Arrays

Figure 6:
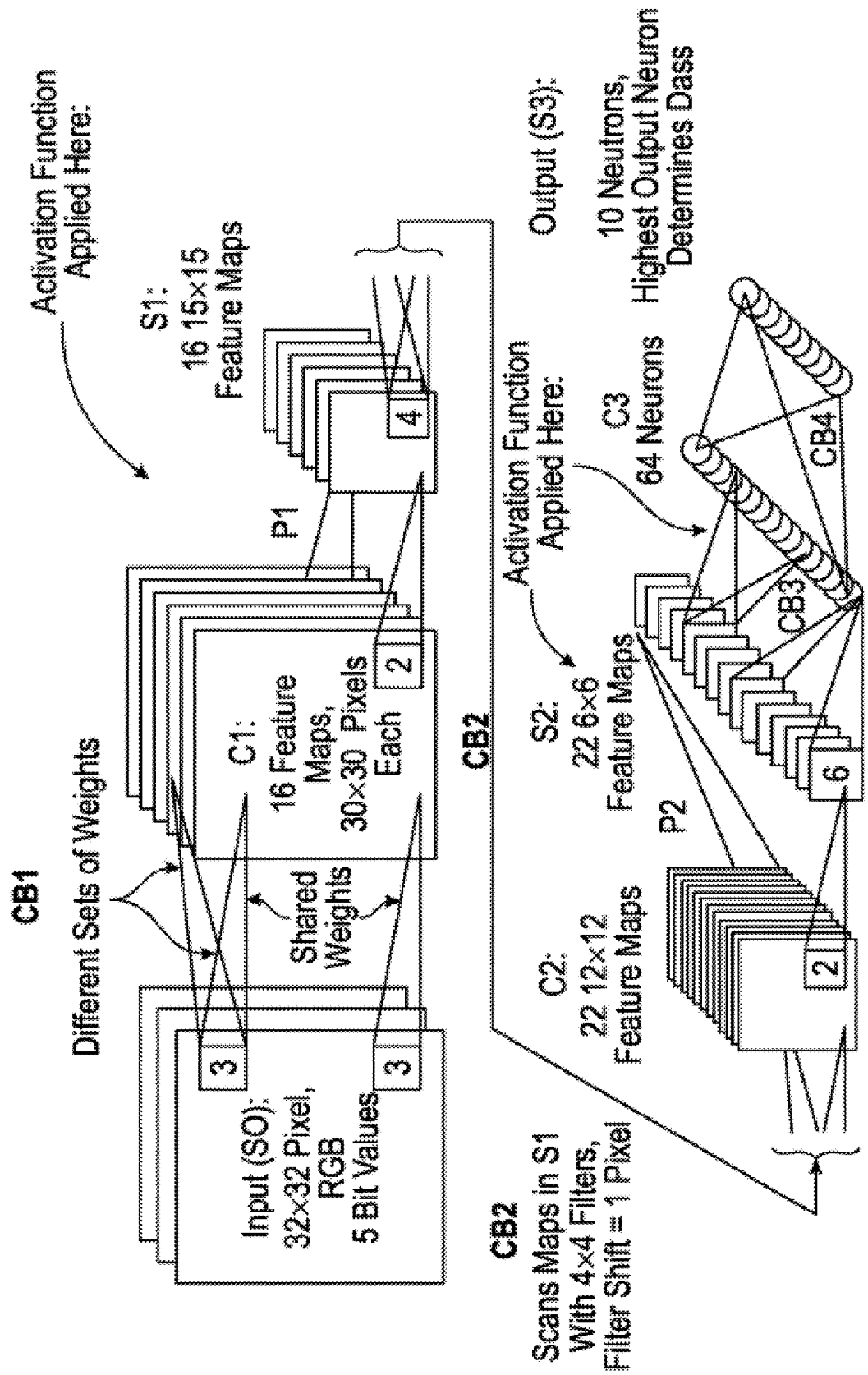
FIG. 6 is a diagram illustrating the different levels of an exemplary artificial neural network utilizing a non-volatile memory array.

FIG. 6 conceptually illustrates a non-limiting example of a neural network utilizing a non-volatile memory array. This example uses the non-volatile memory array neural net for a facial recognition application, but any other appropriate application could be implemented using a non-volatile memory array based neural network.

S0 is the input, which for this example is a 32×32 pixel RGB image with 5 bit precision (i.e. three 32×32 pixel arrays, one for each color R, G and B, each pixel being 5 bit precision). The synapses CB1 going from S0 to C1 have both different sets of weights and shared weights, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, whereby these 9 input values are multiplied by the appropriate weights and, after summing the outputs of that multiplication, a single output value is determined and provided by a first neuron of CB1 for generating a pixel of one of the layers of feature map C1. The 3×3 filter is then shifted one pixel to the right (i.e., adding the column of three pixels on the right, and dropping the column of three pixels on the left), whereby the 9 pixel values in this newly positioned filter are provided to the synapses CB1, whereby they are multiplied by the same weights and a second single output value is determined by the associated neuron. This process is continued until the 3×3 filter scans across the entire 32×32 pixel image, for all three colors and for all bits (precision values). The process is then repeated using different sets of weights to generate a different feature map of C1, until all the features maps of layer C1 have been calculated.

At C1, in the present example, there are 16 feature maps, with 30×30 pixels each. Each pixel is a new feature pixel extracted from multiplying the inputs and kernel, and therefore each feature map is a two dimensional array, and thus in this example the synapses CB1 constitutes 16 layers of two dimensional arrays (keeping in mind that the neuron layers and arrays referenced herein are logical relationships, not necessarily physical relationships—i.e., the arrays are not necessarily oriented in physical two dimensional arrays). Each of the 16 feature maps is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from C1 to S1, which pools values from consecutive, non-overlapping 2×2 regions in each feature map. The purpose of the pooling stage is to average out the nearby location (or a max function can also be used), to reduce the dependence of the edge location for example and to reduce the data size before going to the next stage. At S1, there are 16 15×15 feature maps (i.e., sixteen different arrays of 15×15 pixels each). The synapses and associated neurons in CB2 going from S1 to C2 scan maps in S1 with 4×4 filters, with a filter shift of 1 pixel. At C2, there are 22 12×12 feature maps. An activation function P2 (pooling) is applied before going from C2 to S2, which pools values from consecutive non-overlapping 2×2 regions in each feature map. At S2, there are 22 6×6 feature maps. An activation function is applied at the synapses CB3 going from S2 to C3, where every neuron in C3 connects to every map in S2. At C3, there are 64 neurons. The synapses CB4 going from C3 to the output S3 fully connects S3 to C3. The output at S3 includes 10 neurons, where the highest output neuron determines the class. This output could, for example, be indicative of an identification or classification of the contents of the original image.

Figure 7:
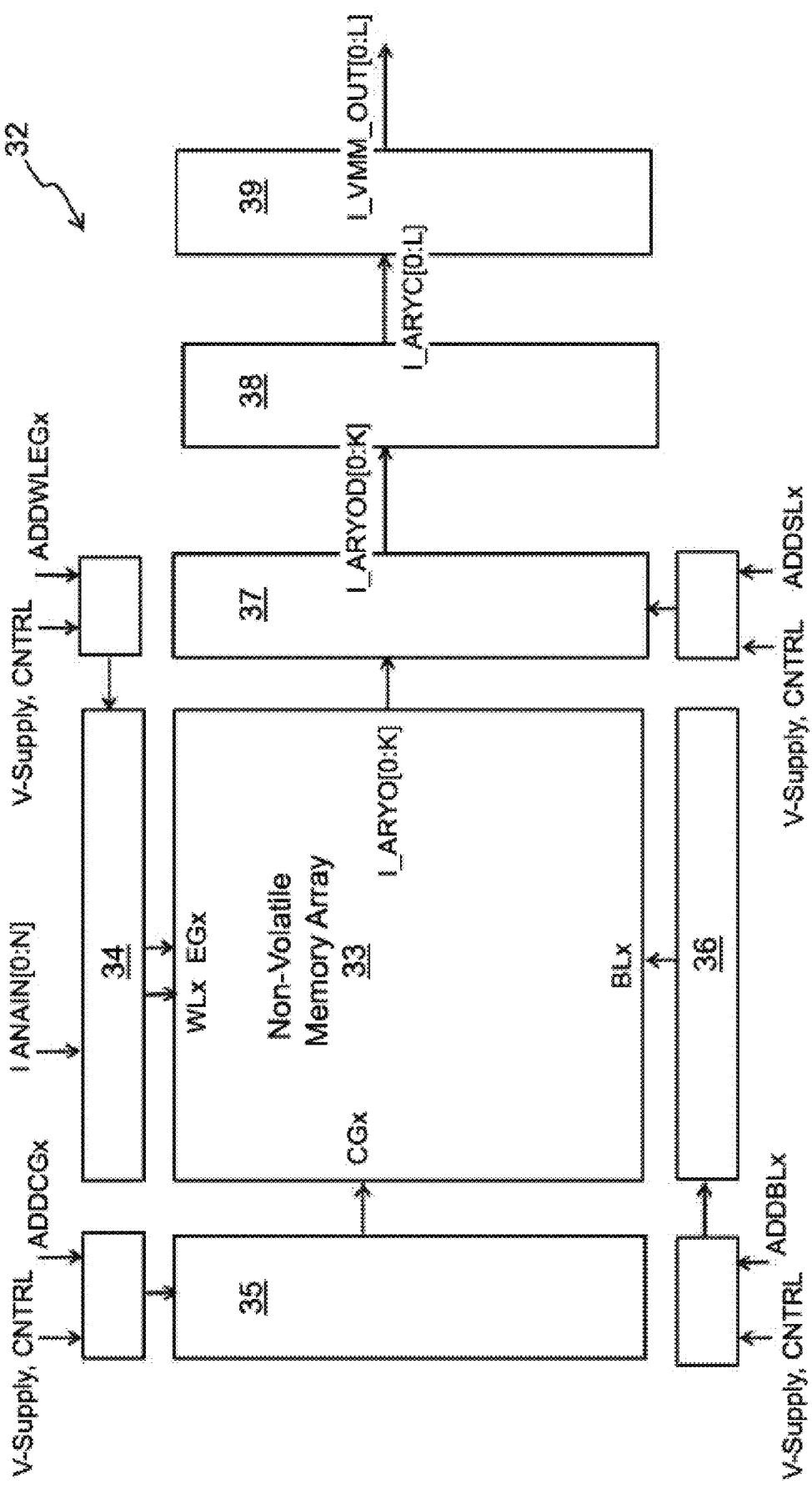
FIG. 7 is a block diagram illustrating a vector multiplier matrix.

Each level of synapses is implemented using an array, or a portion of an array, of non-volatile memory cells. FIG. 7 is a block diagram of the vector-by-matrix multiplication (VMM) array that includes the non-volatile memory cells, and is utilized as the synapses between an input layer and the next layer. Specifically, the VMM 32 includes an array of non-volatile memory cells 33, erase gate and word line gate decoder 34, control gate decoder 35, bit line decoder 36 and source line decoder 37, which decode the inputs for the memory array 33. Source line decoder 37 in this example also decodes the output of the memory cell array. Alternatively, bit line decoder 36 can decode the output of the memory array. The memory array serves two purposes. First, it stores the weights that will be used by the VMM. Second, the memory array effectively multiplies the inputs by the weights stored in the memory array and adds them up per output line (source line or bit line) to produce the output, which will be the input to the next layer or input to the final layer. By performing the multiplication and addition function, the memory array negates the need for separate multiplication and addition logic circuits and is also power efficient due to in-situ memory computation.

The output of the memory array is supplied to a differential summer (such as summing op-amp or summing current mirror) 38, which sums up the outputs of the memory cell array to create a single value for that convolution. The differential summer is such as to realize summation of positive weight and negative weight with positive input. The summed up output values are then supplied to the activation function circuit 39, which rectifies the output. The activation function may include sigmoid, tanh, or ReLU functions. The rectified output values become an element of a feature map as the next layer (C1 in the description above for example), and are then applied to the next synapse to produce next feature map layer or final layer. Therefore, in this example, the memory array constitutes a plurality of synapses (which receive their inputs from the prior layer of neurons or from an input layer such as an image database), and summing op-amp 38 and activation function circuit 39 constitute a plurality of neurons.

Figure 8:
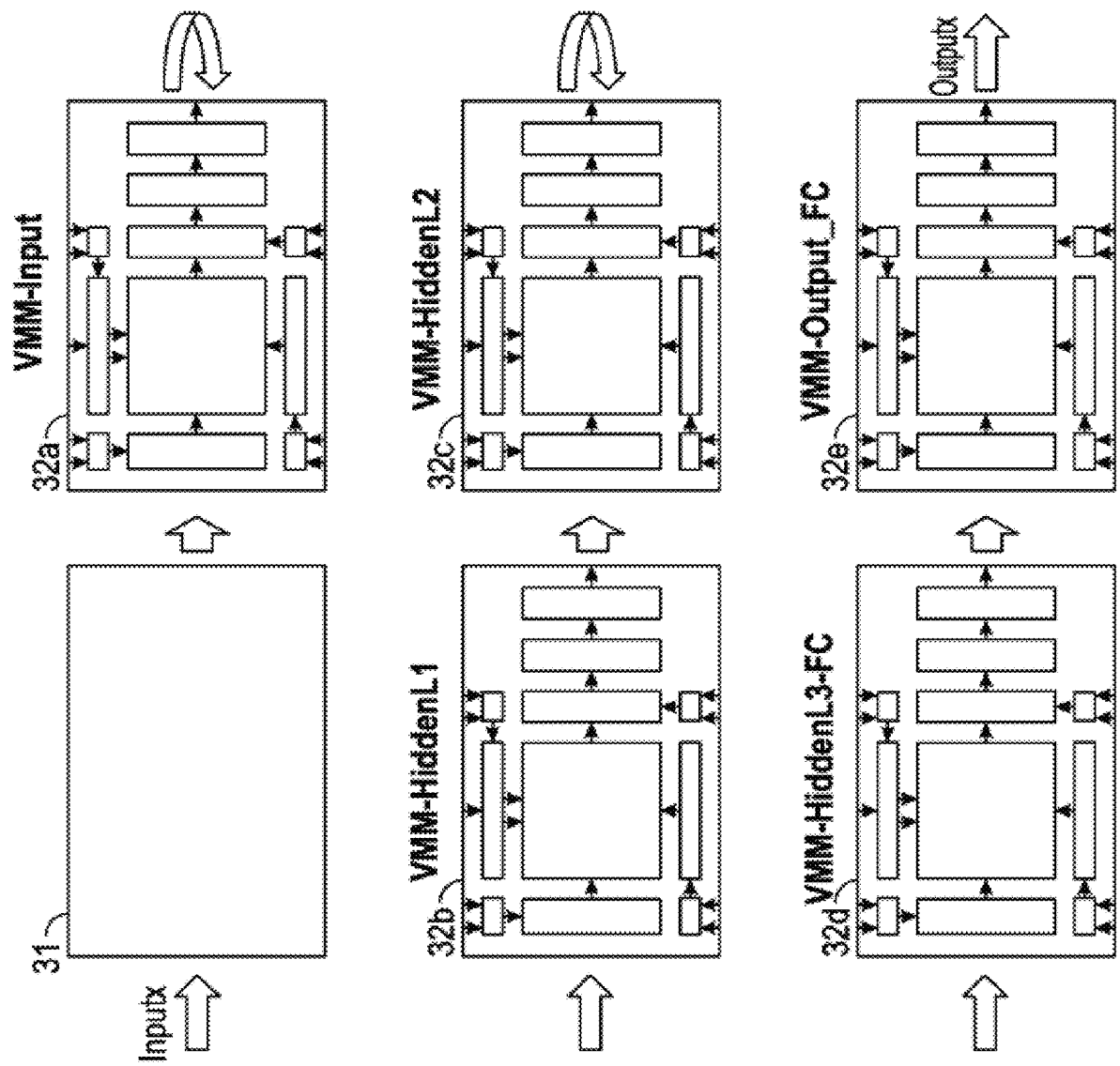
FIG. 8 is a block diagram illustrating various levels of a vector multiplier matrix.

FIG. 8 is a block diagram of the various levels of VMM. As shown in FIG. 8, the input is converted from digital to analog by digital-to-analog converter 31, and provided to input VMM 32a. The converted analog inputs could be voltage or current. The input D/A conversion for the first layer could be done by using a function or a LUT (look up table) that maps the inputs to appropriate analog levels for the matrix multiplier. The input conversion could also be done by an A/A Converter to convert an external analog input to a mapped analog input to the VMM. The output generated by the input VMM 32a is provided as an input to the next VMM (hidden level 1) 32b, which in turn generates an output that is provided as an input to the next VMM (hidden level 2) 32b, and so on. The various layers of VMM's 32 function as different layers of synapses and neurons of a convolutional neural network (CNN). Each VMM can be a stand-alone non-volatile memory array, or multiple VMMs could utilize different portions of the same non-volatile memory array, or multiple VMMs could utilize overlapping portions of the same non-volatile memory array. The example shown in FIG. 8 contains five layers (32a,32b, 32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers.

Vector-by-Matrix Multiplication (VMM) Arrays

Figure 9:
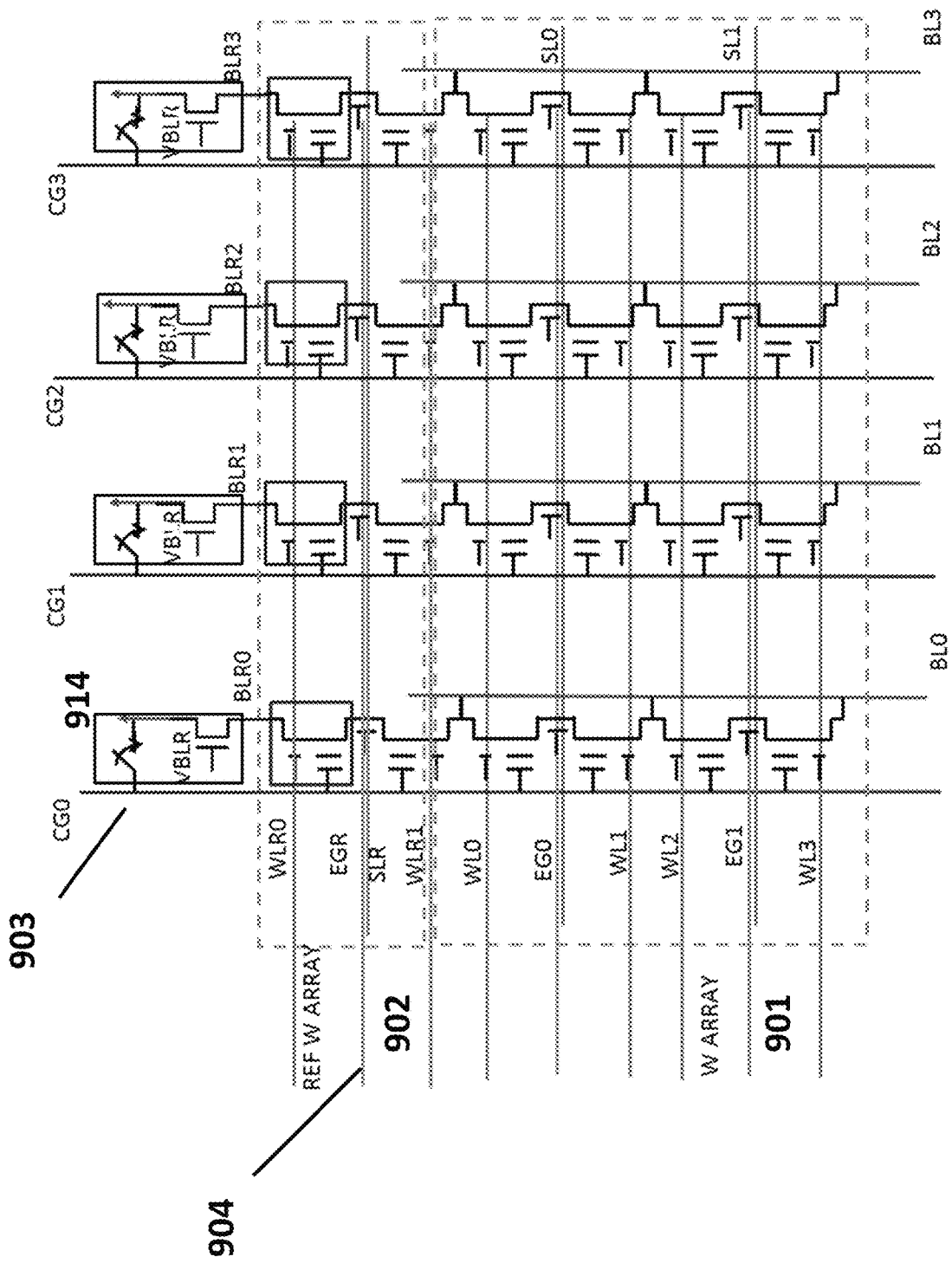
FIG. 9 depicts another embodiment of a vector multiplier matrix.

FIG. 9 depicts neuron VMM 900, which is particularly suited for memory cells of the type shown in FIG. 3, and is utilized as the synapses and parts of neurons between an input layer and the next layer. VMM 900 comprises a memory array 901 of non-volatile memory cells and reference array 902 (at the top of the array). Alternatively, another reference array can be placed at the bottom. In VMM 900, control gates line such as control gate line 903 run in a vertical direction (hence reference array 902 in the row direction, orthogonal to the input control gate lines), and erase gate lines such as erase gate line 904 run in a horizontal direction. Here, the inputs are provided on the control gate lines, and the output emerges on the source lines. In one embodiment only even rows are used, and in another embodiment, only odd rows are used. The current placed on the source line performs a summing function of all the currents from the memory cells connected to the source line.

As described herein for neural networks, the flash cells are preferably configured to operate in sub-threshold region.

The memory cells described herein are biased in weak inversion:

$$Ids = Io * e^{(Vg-Vth)/kVt} = w * Io * e^{(Vg)/kVt}$$

$$w = e^{(-Vth)/kVt}$$

For an I-to-V log converter using a memory cell to convert input current into an input voltage:

$$Vg = k*Vt*log[Ids/wp*Io]$$

For a memory array used as a vector matrix multiplier VMM, the output current is:

$$Iout = wa * Io * e^{(Vg)/kVt}, \text{ namely}$$

$$Iout = (wa/wp)*Iin = W*Iin$$

$$W = e^{(Vthp-Vtha)/kVt}$$

A wordline or control gate can be used as the input for the memory cell for the input voltage.

Alternatively, the flash memory cells can be configured to operate in the linear region:

$$Ids = beta*(Vgs-Vth)*Vds; \ beta = u*Cox*W/L$$

$$W \ \alpha (Vgs-Vth)$$

For an I-to-V linear converter, a memory cell operating in the linear region can be used to convert linearly an input/output current into an input/output voltage.

Other embodiments for the ESF vector matrix multiplier are as described in U.S. patent application No. application Ser. No. 15/826,345, which is incorporated by reference herein. A sourceline or a bitline can be used as the neuron output (current summation output).

Figure 10:
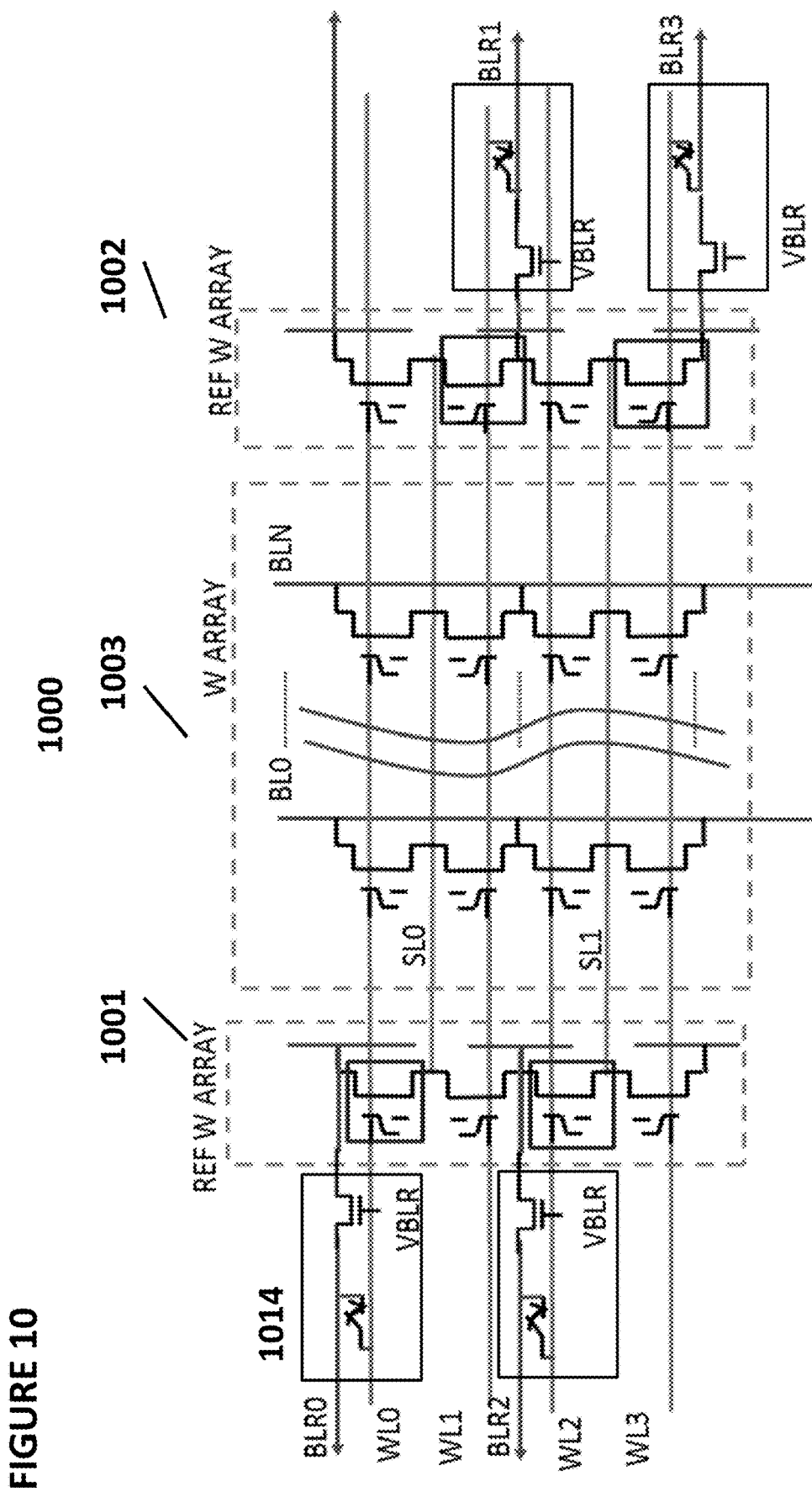
FIG. 10 depicts another embodiment of a vector multiplier matrix.

FIG. 10 depicts neuron VMM 1000, which is particularly suited for memory cells of the type shown in FIG. 2, and is utilized as the synapses between an input layer and the next layer. VMM 1000 comprises a memory array 1003 of non-volatile memory cells, reference array 1001, and reference array 1002. Reference arrays 1001 and 1002, in column direction of the array, serve to convert current inputs flowing into terminals BLR0-3 into voltage inputs WL0-3. In effect, the reference memory cells are diode connected through multiplexors with current inputs flowing into them. The reference cells are tuned (e.g., programmed) to target reference levels. The target reference levels are provided by a reference mini-array matrix. Memory array 1003 serves two purposes. First, it stores the weights that will be used by the VMM 1000. Second, memory array 1003 effectively multiplies the inputs (current inputs provided in terminals BLR0-3; reference arrays 1001 and 1002 convert these current inputs into the input voltages to supply to wordlines WL0-3) by the weights stored in the memory array and then add all the results (memory cell currents) to produce the output, which will be the input to the next layer or input to the final layer. By performing the multiplication and addition function, the memory array negates the need for separate multiplication and addition logic circuits and is also power efficient. Here, the voltage inputs are provided on the word lines, and the output emerges on the bit line during a read (inference) operation. The current placed on the bit line performs a summing function of all the currents from the memory cells connected to the bitline.

FIG. 11 depicts operating voltages for VMM 1000. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

Figure 12:
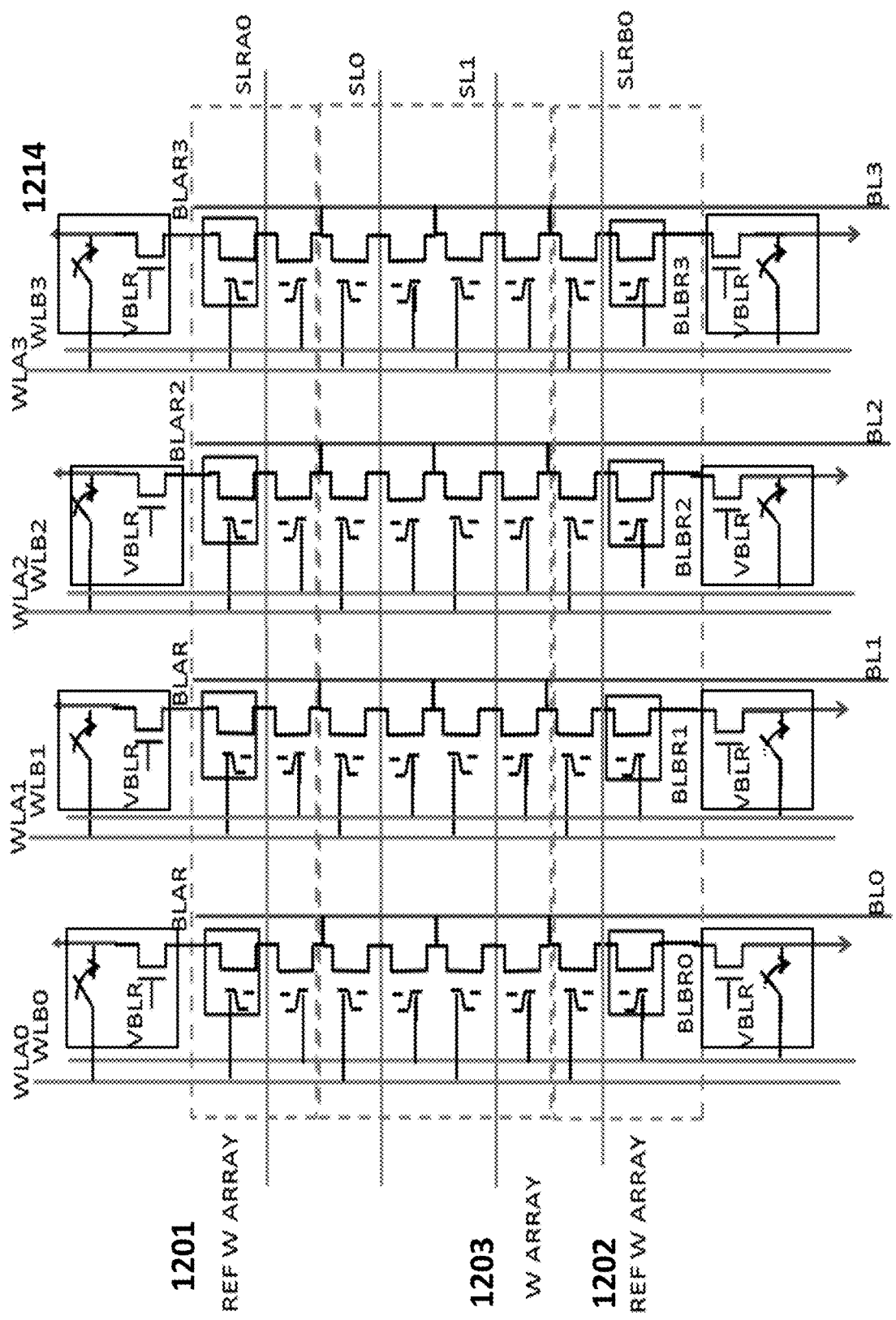
FIG. 12 depicts another embodiment of a vector multiplier matrix.

FIG. 12 depicts neuron VMM 1200, which is particularly suited for memory cells of the type shown in FIG. 2, and is utilized as the synapses and parts of neurons between an input layer and the next layer. VMM 1200 comprises a memory array 1203 of non-volatile memory cells, reference array 1201, and reference array 1202. The reference array 1201 and 1202 run in row direction of the array VMM 1200 is similar to VMM 1000 except that in VMM 1200 the word lines run in the vertical direction. Here, the inputs are provided on the word lines, and the output emerges on the source line during a read operation. The current placed on the source line performs a summing function of all the currents from the memory cells connected to the source line.

FIG. 13 depicts operating voltages for VMM 1200. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

Figure 14:
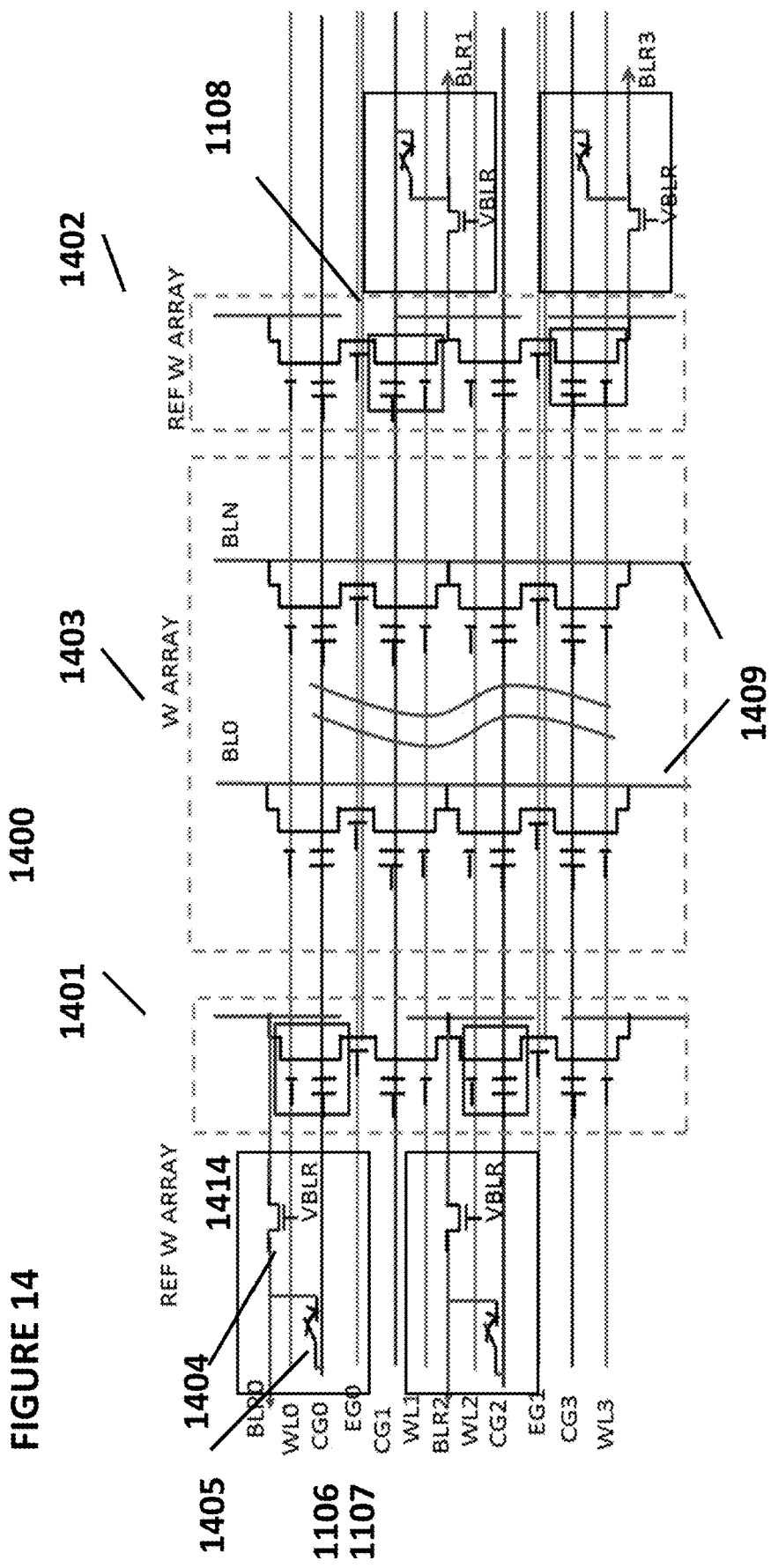
FIG. 14 depicts another embodiment of a vector multiplier matrix.

FIG. 14 depicts neuron VMM 1400, which is particularly suited for memory cells of the type shown in FIG. 3, and is utilized as the synapses and parts of neurons between an input layer and the next layer. VMM 1400 comprises a memory array 1403 of non-volatile memory cells, reference array 1401, and reference array 1402. The reference array 1401 and 1402 serves to convert current inputs flowing into terminals BLR0-3 into voltage inputs CG0-3. In effect, the reference memory cells are diode connected through cascoding mulitplexors 1414 with current inputs flowing into them. The mux 1414 includes a mux 1405 and a cascoding transistor 1404 to ensure a constant voltage on bitline of reference cells in read. The reference cells are tuned to target reference levels. Memory array 1403 serves two purposes. First, it stores the weights that will be used by the VMM 1400. Second, memory array 1403 effectively multiplies the inputs (current inputs provided to terminals BLR0-3; reference arrays 1401 and 1402 convert these current inputs into the input voltages to supply to the control gates CG0-3) by the weights stored in the memory array and then add all the results (cell currents) to produce the output, which will be the input to the next layer or input to the final layer. By performing the multiplication and addition function, the memory array negates the need for separate multiplication and addition logic circuits and is also power efficient. Here, the inputs are provided on the word lines, and the output emerges on the bitline during a read operation. The current placed on the bitline performs a summing function of all the currents from the memory cells connected to the bitline.

VMM 1400 implements uni-directional tuning for memory cells in memory array 1403. That is, each cell is erased and then partially programmed until the desired charge on the floating gate is reached. If too much charge is placed on the floating gate (such that the wrong value is stored in the cell), the cell must be erased and the sequence of partial programming operations must start over. As shown, two rows sharing the same erase gate need to be erased together (to be known as a page erase), and thereafter, each cell is partially programmed until the desired charge on the floating gate is reached, FIG. 15 depicts operating voltages for VMM 1400. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

Figure 16:
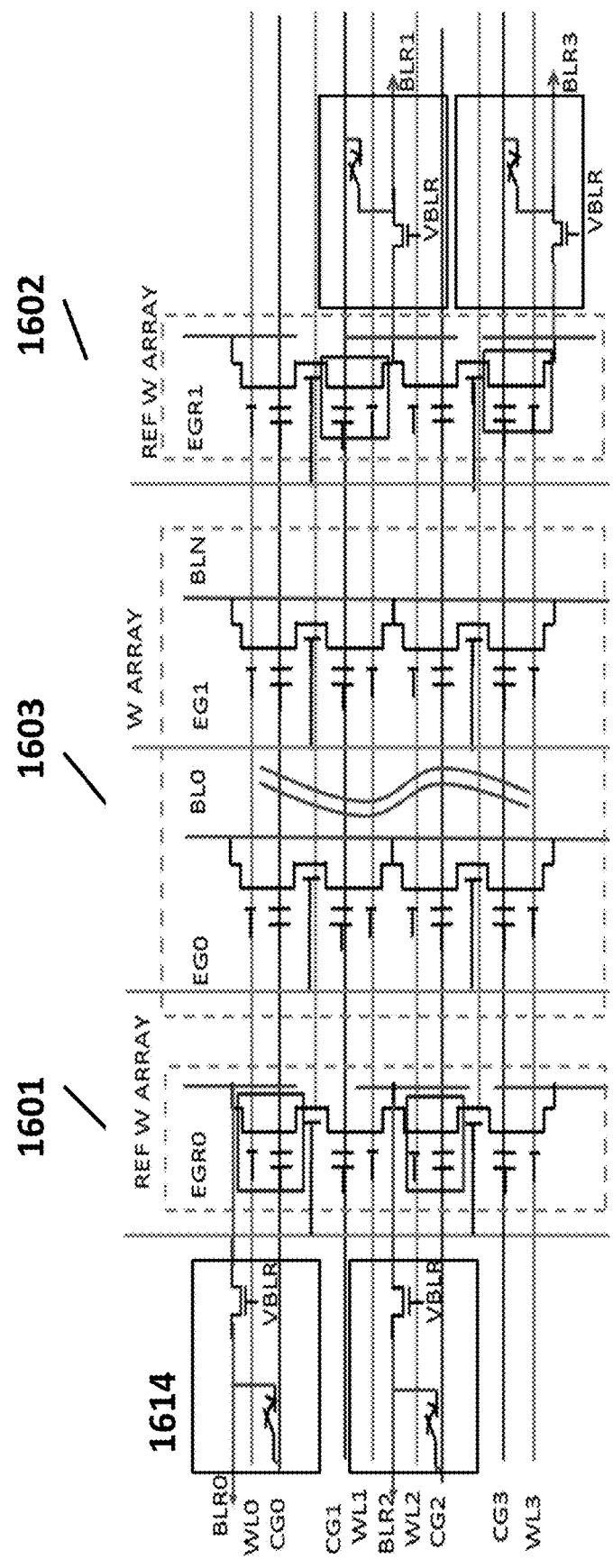
FIG. 16 depicts another embodiment of a vector multiplier matrix.

FIG. 16 depicts neuron VMM 1600, which is particularly suited for memory cells of the type shown in FIG. 3, and is utilized as the synapses and parts of neurons between an input layer and the next layer. VMM 1600 comprises a memory array 1603 of non-volatile memory cells, reference array 1601, and reference array 1602. EG lines are run vertically while CG and SL lines are run horizontally. VMM 1600 is similar to VMM 1400, except that VMM1600 implements bi-directional tuning, where each individual cell can be completely erased, partially programmed, and partially erased as needed to reach the desired amount of charge on the floating gate. As shown, reference arrays 1601 and 1602 convert input current in the terminal BLR0-3 into control gate voltages CG0-3 (through the action of diode-connected reference cells through multiplexors) to be applied to the memory cells in the row direction. The current output (neuron) is in the bitline which sums all currents from the memory cells connected to the bitline.

FIG. 17 depicts operating voltages for VMM 1600. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

The prior art includes a concept known as long short-term memory (LSTM). LSTM units often are used in neural networks. LSTM allows a neural network to remember information over arbitrary time intervals and to use that information in subsequent operations. A conventional LSTM unit comprises a cell, an input gate, an output gate, and a forget gate. The three gates regulate the flow of information into and out of the cell. VMMs are particularly useful in LSTM units.

Figure 32:
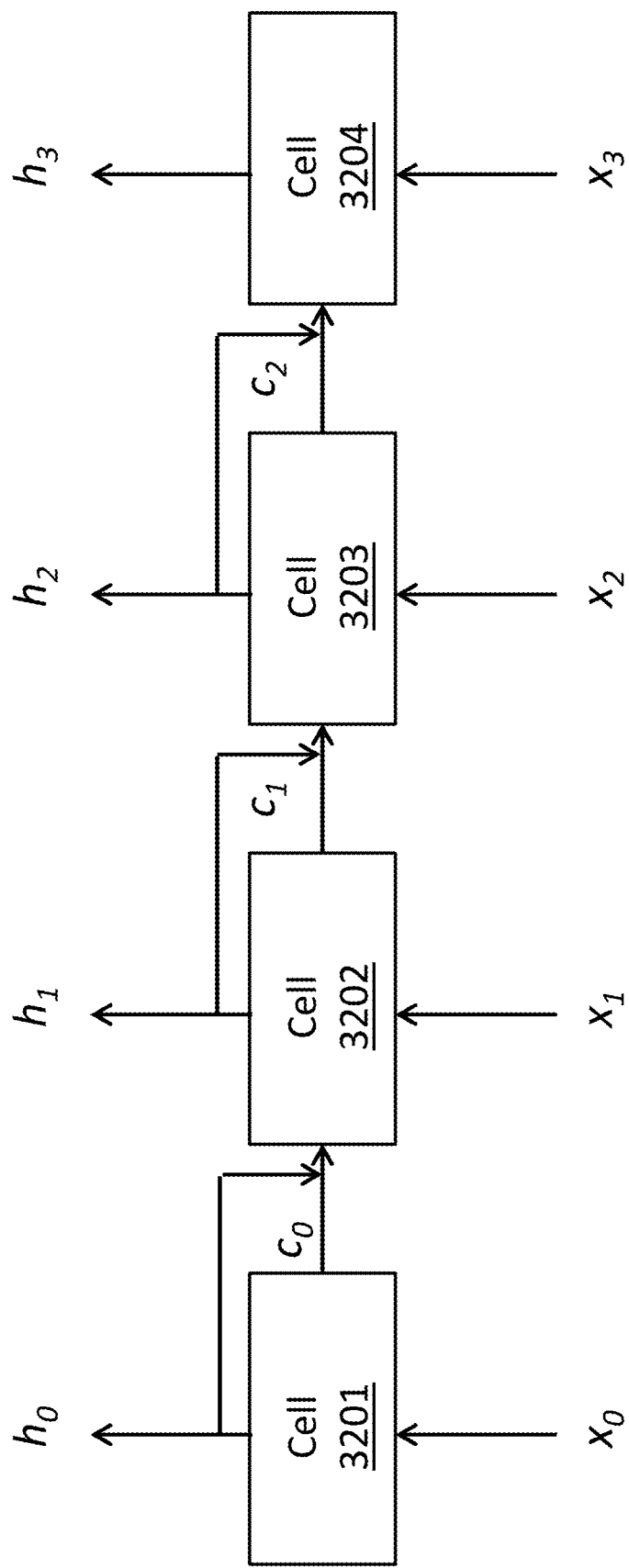
FIG. 32 depicts a prior art long short term memory system.

FIG. 32 depicts exemplary LSTM 3200. LSTM in this example comprises cells 3201, 3202, 3203, and 3204. Cell 3201 receives input vector $x_0$ and generates output vector $h_0$ and cell state vector $c_0$. Cell 3202 receives input vector $x_1$, the output vector (hidden state) $h_0$, and cell state $c_0$ from cell 3201 and generates output vector $h_1$ and cell state vector $c_1$. Cell 3203 receives input vector $x_2$, the output vector (hidden state) $h_1$, and cell state $c_1$ from cell 3202 and generates output vector $h_2$ and cell state vector $c_2$. Cell 3204 receives input vector $x_3$, the output vector (hidden state) $h_2$, and cell state $c_2$ from cell 3203 and generates output vector h3. Additional cells can be used, and an LSTM with four cells is merely an example.

Figure 33:
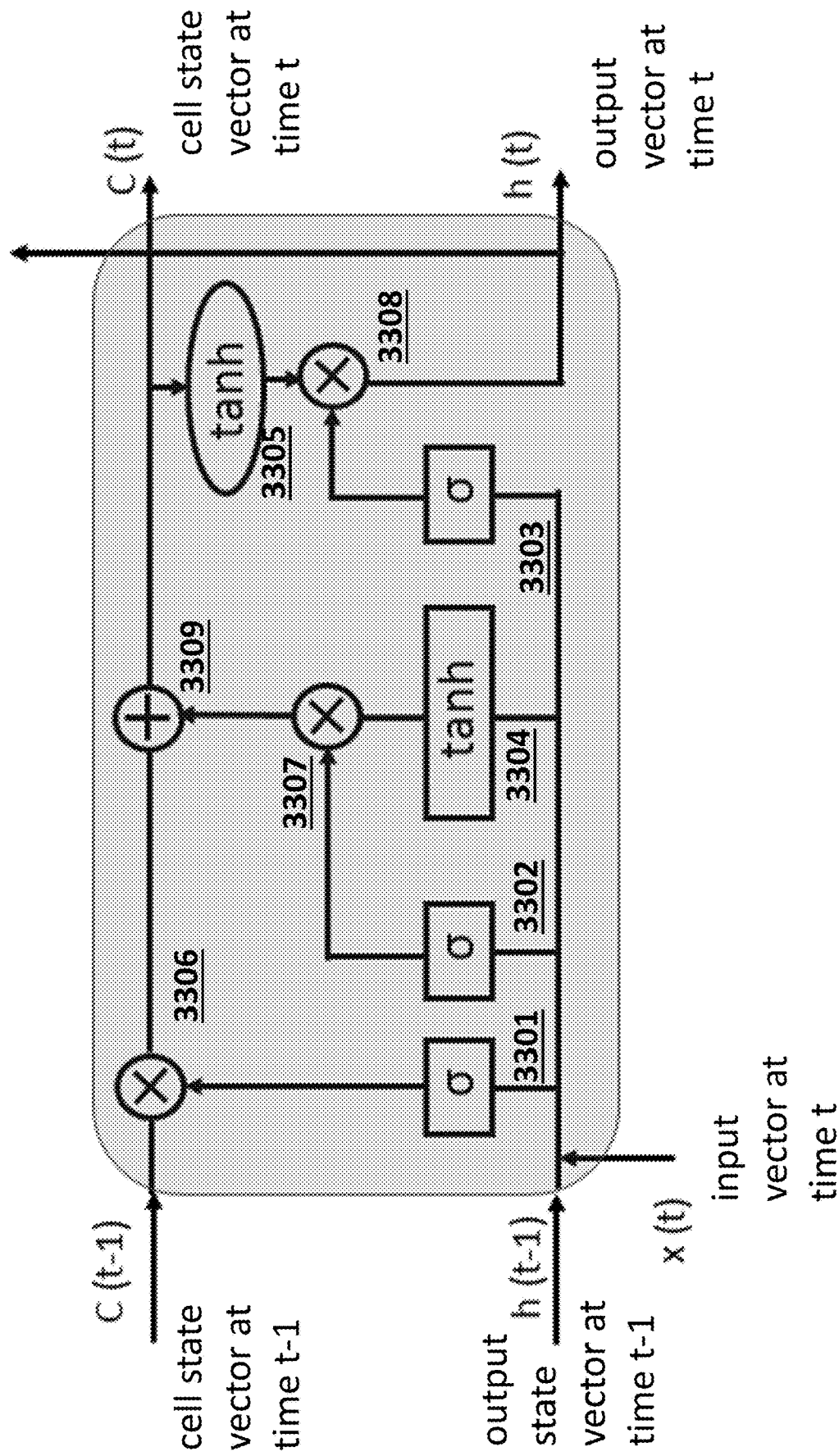
FIG. 33 depicts an exemplary cell in a prior art long short term memory system.

FIG. 33 depicts an exemplary implementation of LSTM cell 3300, which can be used for cells 3201, 3202, 3203, and 3204 in FIG. 32. LSTM cell 3300 receives input vector x(t) and cell state vector c(t−1) from a preceding cell and generates cell state(t) and output vector h(t).

LSTM cell 3300 comprises sigmoid function devices 3301, 3302, and 3303, each of which applies a number between 0 and 1 to control how much of each component in the input vector is allowed through to the output vector. LSTM cell 3300 also comprises tanh devices 3304 and 3305 to apply a hyperbolic tangent function to an input vector, multiplier devices 3306, 3307, and 3308 to multiply two vectors together, and addition device 3309 to add two vectors together.

Figure 34:
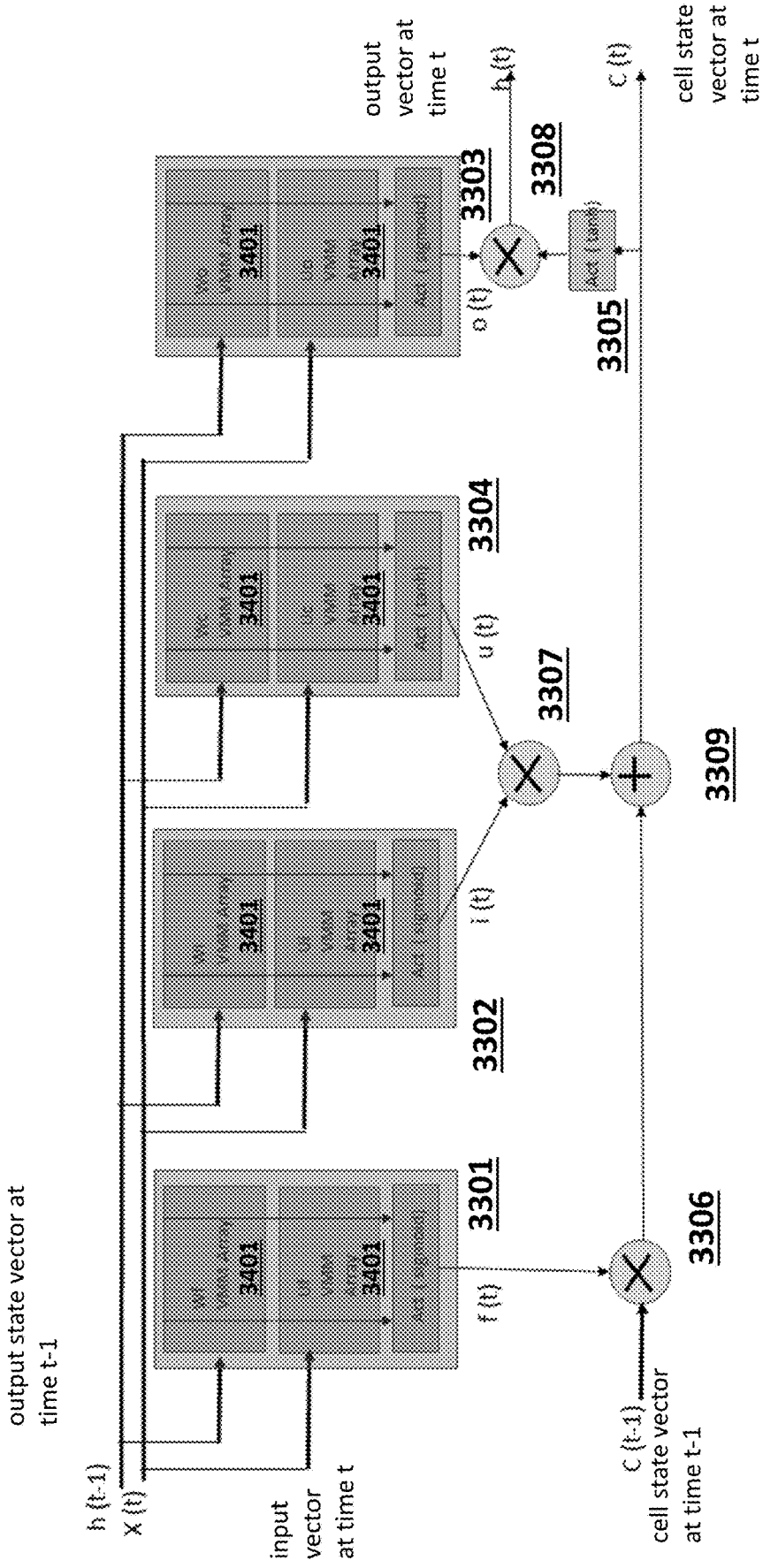
FIG. 34 depicts an implementation of the exemplary cell in the long short term memory system of FIG. 33.

FIG. 34 depicts LSTM cell 3400, which is an example of an implementation of LSTM cell 3300. For the reader's convenience, the same numbering from FIG. 33 and LSTM cell 3300 is used in FIG. 34 and LSTM cell 3400. As can be seen in FIG. 34, sigmoid function devices 3301, 3302, and 3303 and tanh devices 3304 and 3305 each comprise multiple VMM arrays 3401. Thus, it can be seen that VMM arrays are particular important in LSTM cells used in certain neural network systems.

It can be further appreciated that LSTM systems will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient. The embodiments described below therefore attempt to minimize the circuitry required outside of the VMM arrays themselves.

Similarly, an analog VMM implementation can be used for a GRU (gated recurrent unit) system. GRUs are a gating mechanism in recurrent neural networks. GRUs are similar to LSTMs, with one notable difference being that GRUs lack an output gate.

Figure 35:
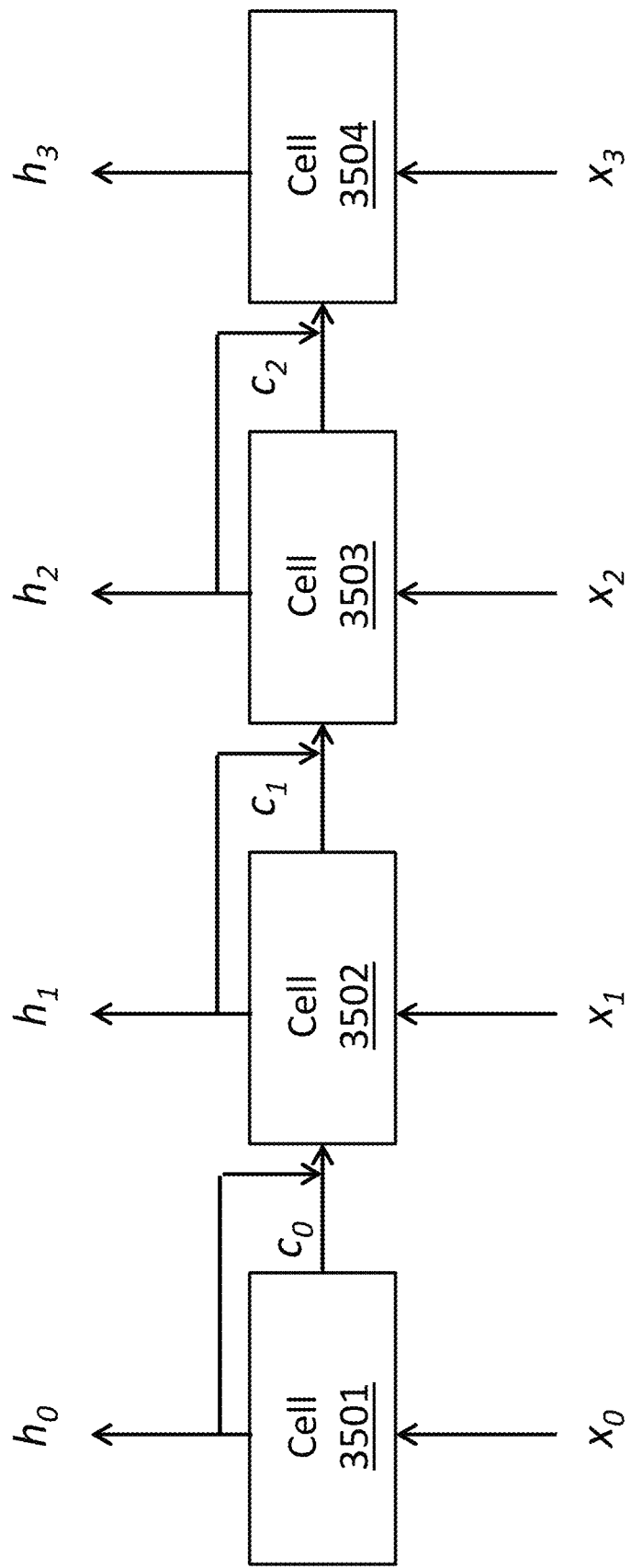
FIG. 35 depicts a prior art gated recurrent unit system.

FIG. 35 depicts exemplary GRU 3500. GRU in this example comprises cells 3501, 3502, 3503, and 3504. Cell 3501 receives input vector $x_0$ and generates output vector $h_0$ and cell state vector $c_0$. Cell 3502 receives input vector $x_1$, the output vector (hidden state) $h_0$, and cell state $c_0$ from cell. 3501 and generates output vector $h_1$ and cell state vector $c_1$. Cell 3503 receives input vector $x_2$, the output vector (hidden state) $h_1$, and cell state $c_1$ from cell 3502 and generates output vector $h_2$ and cell state vector $c_2$. Cell 3504 receives input vector $x_3$, the output vector (hidden state) $h_2$, and cell state $c_2$ from cell 3503 and generates output vector h3. Additional cells can be used, and an GRU with four cells is merely an example.

Figure 36:
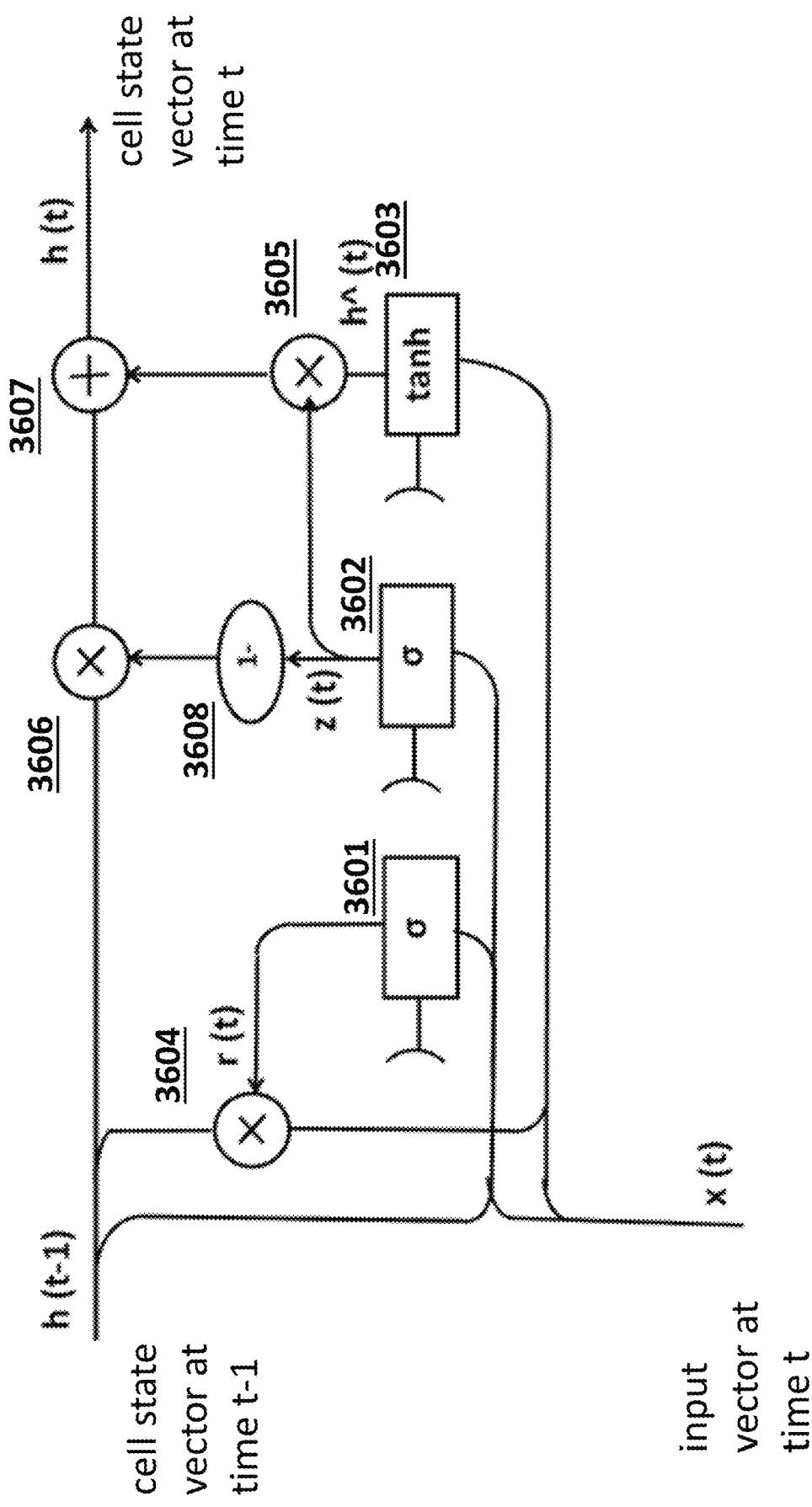
FIG. 36 depicts an exemplary cell in a prior art gated recurrent unit system.

FIG. 36 depicts an exemplary implementation of GRU cell 3600, which can be used for cells 3501, 3502, 3503, and 3504 in FIG. 35. GRU cell 3600 receives input vector x(t) and cell state vector h(t−1) from a preceding cell and generates cell state h(t). GRU cell 3600 comprises sigmoid function devices 3601 and 3602, each of which applies a number between 0 and 1 to components from cell state h(t−1) and input vector x(t). GRU cell 3600 also comprises tanh device 3603 to apply a hyperbolic tangent function to an input vector, multiplier devices 3604, 3605, and 3606 to multiply two vectors together, addition device 3607 to add two vectors together, and complementary device 3608 to subtract an input from 1 to generate an output.

Figure 37:
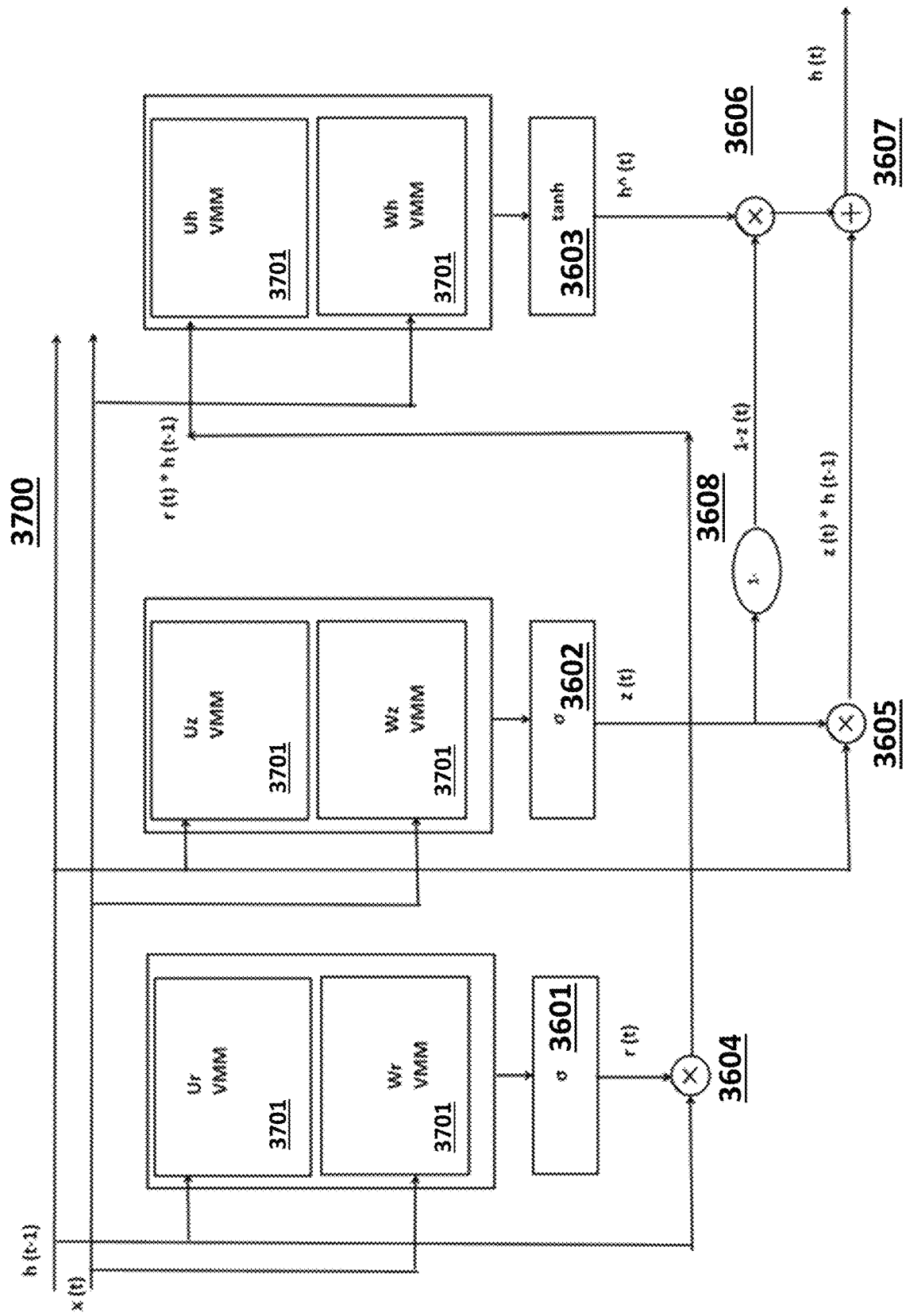
FIG. 37 depicts an implementation of the exemplary cell in the gated recurrent unit system of FIG. 36.

FIG. 37 depicts GRU cell 3700, which is an example of an implementation of GRU cell 3600. For the reader's convenience, the same numbering from FIG. 36 and GRU cell 3600 is used in FIG. 37 and GRU cell 3700. As can be seen in FIG. 37, sigmoid function devices 3601 and 3602, and tanh device 3603 each comprise multiple VMM arrays 3701. Thus, it can be seen that VMM arrays are of particular use in GRU cells used in certain neural network systems.

It can be further appreciated that GRU systems will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient. The embodiments described below therefore attempt to minimize the required outside of the VMM arrays themselves.

FIG. 18A depicts an exemplary reference transistor 1801 such as used for reference transistor in reference array 902 in FIG. 9, reference array 1001/1002 in FIG. 10, reference array 1201/1202 in FIG. 12, reference array 1401/1402 in FIG. 14, reference array 1601/1602 in FIG. 16. When reference transistor 1801 is operating in the sub-threshold region, as the voltage Vgs increases, the amount of drawn current, Ids, increases in a log linear (exponential) fashion. An exemplary current-voltage characteristic curve 1802 is shown in FIG. 18B. It can be seen that the log curve 1802 has a certain slope.

When reference transistor 1801 is operating in the linear region, as the voltage Vgs increases, the amount of drawn current, Ids, increases in a linear fashion. An exemplary current-voltage characteristic curve 1802 is shown in FIG. 18C. It can be seen that the curve 1803 has a certain slope.

FIG. 18D depicts an exemplary memory cell 1804. When memory cell 1804 is operating in the sub-threshold region, as the voltage Vwl/Vcg increases, the amount of drawn current, Ids, increases in exponential fashion. An exemplary current-voltage characteristic curve 1805 is shown in FIG. 18E. It can be seen that the curve 1805 has a certain slope.

FIG. 18D depicts an exemplary memory cell 1804. When memory cell 1804 is operating in the linear region, as the voltage Vwl/Vcg increases, the amount of drawn current, Ids, increases in linear fashion. An exemplary current-voltage characteristic curve 1806 is shown in FIG. 18F. It can be seen that the curve 1804 has a certain slope. As shown, the slope in I-V curve between the reference transistor and the memory cell can be different, hence a normalization (making them having similar slope) is needed to match between the two.

Figure 19:
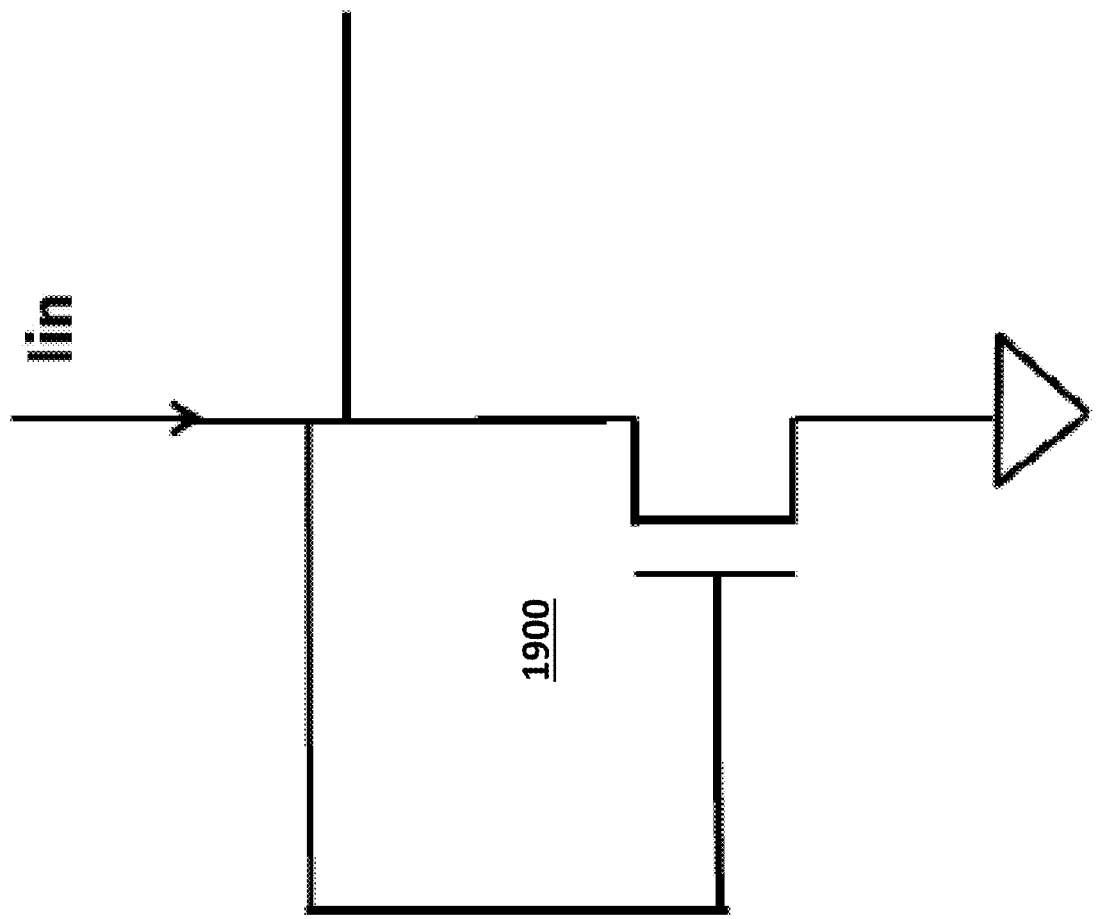
FIG. 19 depicts a reference transistor.
Figure 20:
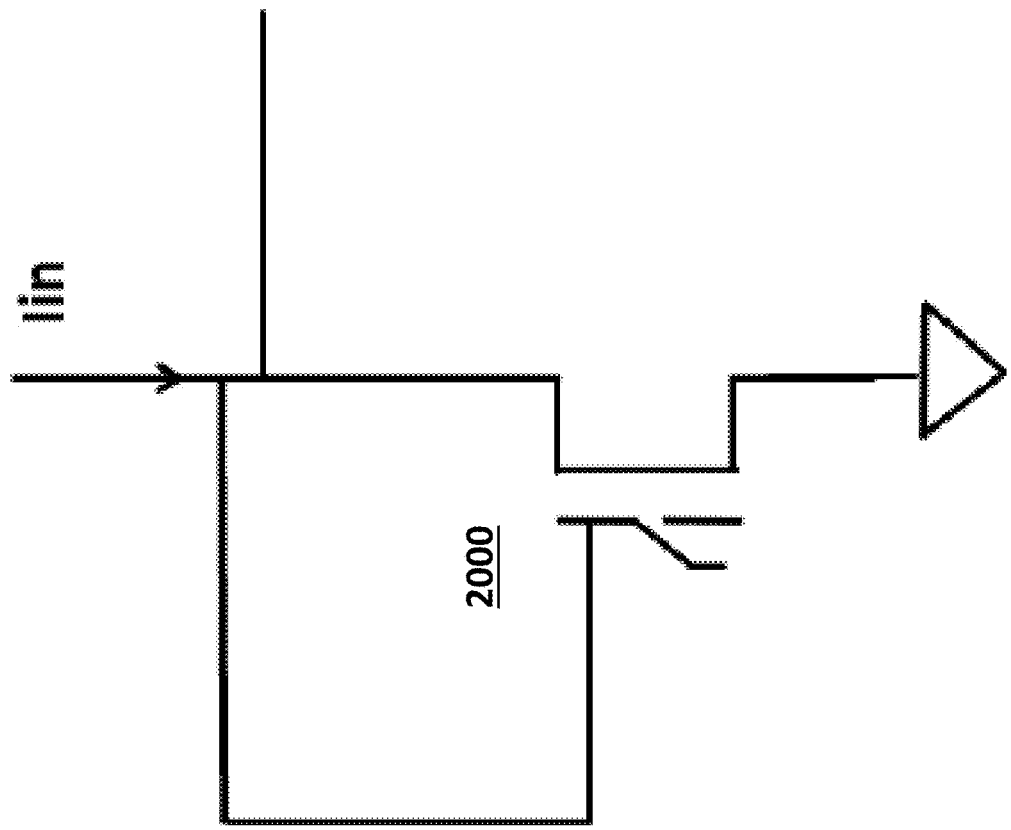
FIG. 20 depicts a reference memory cell.
Figure 21:
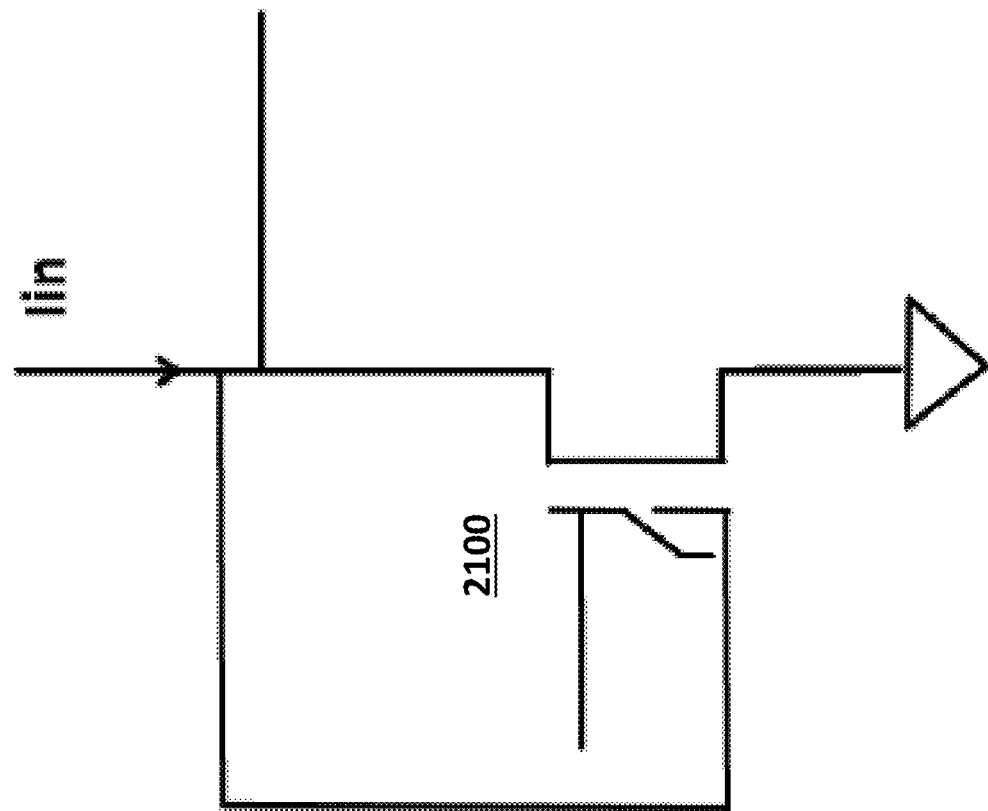
FIG. 21 depicts another reference memory cell.

FIG. 19 depicts an exemplary reference transistor 1900 with a configuration, which is the same configuration shown in FIG. 18A. FIG. 20 depicts another exemplary reference memory cell with another configuration (wordline coupled to bitline), and FIG. 21 depicts another exemplary reference memory cell with another configuration (floating gate FG coupled to bitline). It can be appreciated that each of these devices might have a different current-voltage characteristic curve.

The embodiments described herein compensate for the difference in slope of the current-voltage characteristic curves of reference transistors, reference memory cells, and/or selected memory cells.

In a system with two devices with different sub-threshold current-voltage characteristic curves, the drain-source current through the first device will be:

$$Ids1=Ids0*exp(Vgs1-Vt)/k1*Ut$$

The drain-source current through the second device will be:

$$Ids2=Ids0*exp(Vgs2-Vt)/k2*Ut$$

It can be seen that in each instance, the slope will be proportional to ~1/k.

In some of the embodiments that follow, slope normalization is implemented by using a gate-source voltage on the first device of:

$$Vgs1=k*Vgs2$$

This will mean that Ids1 and Ids will have the same slope after slope normalization.

Figure 22:
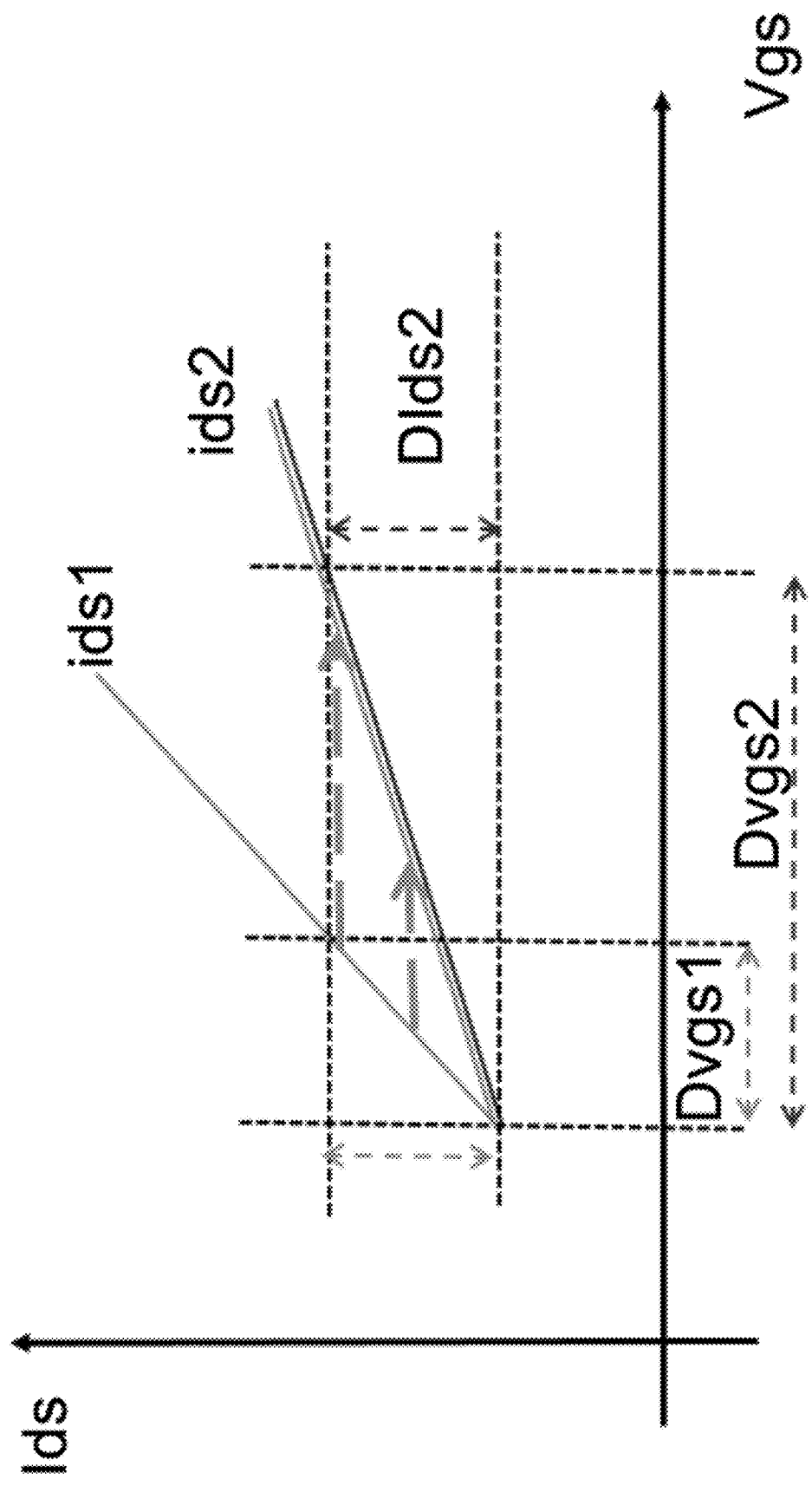
FIG. 22 depicts changes in characteristic curve based on slope compensation.

This is shown graphically in FIG. 22, a voltage of Vgs1=k*Vgs2 is applied to device 1, which causes the slope of the current-voltage characteristic curve of the first device to approximate the slope of the current-voltage characteristic curve of the second device Various embodiments for performing slope normalization will now be described.

Figure 23:
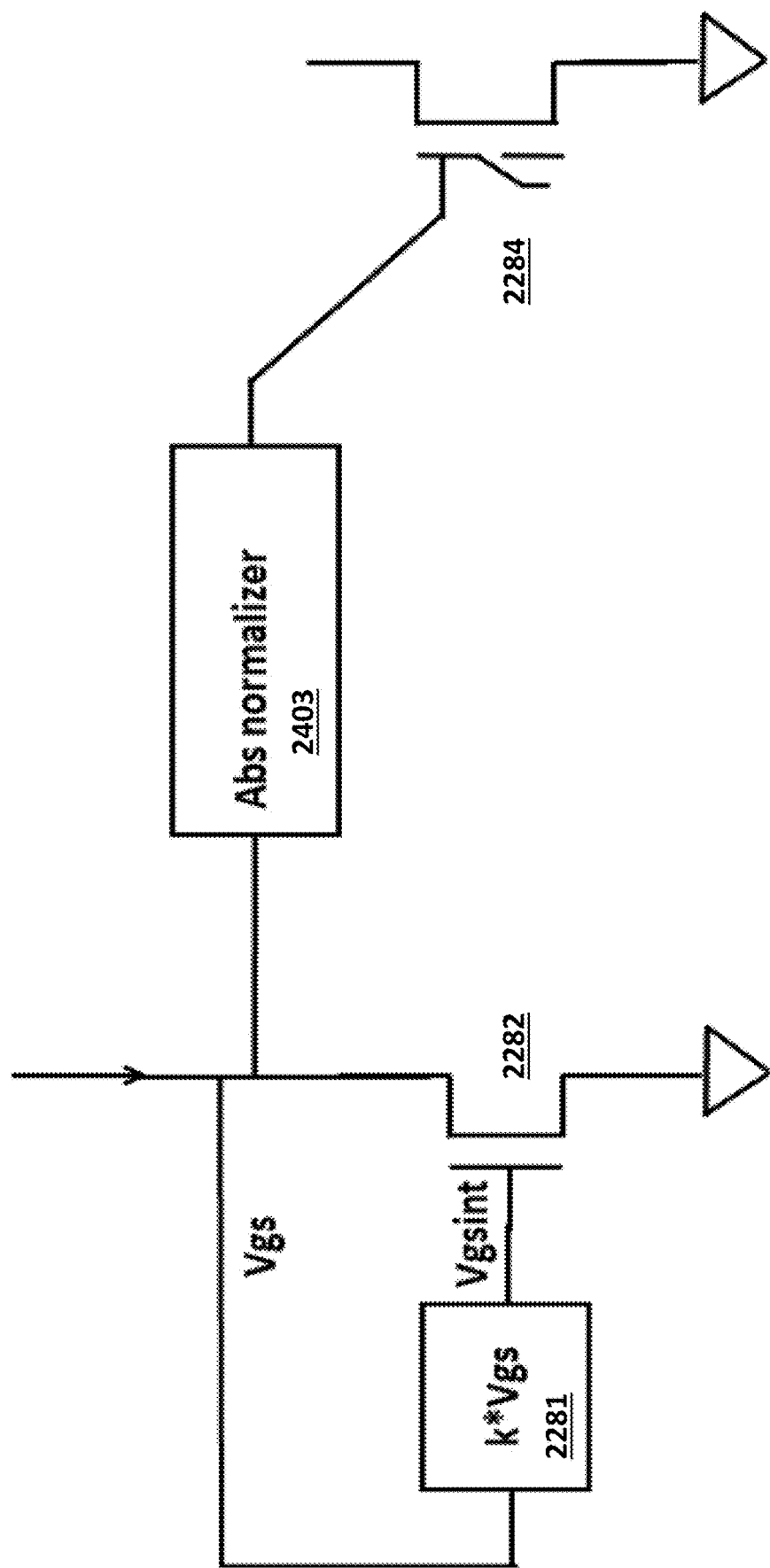
FIG. 23 depicts an embodiment of a slope compensation system.

FIG. 23 depicts slope normalization system 2280, comprising reference transistor 2282 (such as used for reference transistor in reference array 902 in FIG. 9, reference array 1001/1002 in FIG. 10, reference array 1201/1202 in FIG. 12, reference array 1401/1402 in FIG. 14, reference array 1601/1602 in FIG. 16,) selected memory cell 2284 (such as part of array 901 in FIG. 9, array 1003 in FIG. 10, array 1203 in FIG. 12, array 1403 in FIG. 14, array 1603 in FIG. 16), gate driver 2281, and absolute normalizer circuit 2403. Gate driver 2281 receives an input voltage, Vgs, and multiplies that input voltage by k to generate an output voltage Vgsint, which is applied to the date of reference transistor 2282. Absolute normalizer circuit 2403 can me a trimmable current mirror (a current mirror circuit to adjust ratio between current from reference transistor and current output from memory cell), where the trimming process can adjust for discrepancies caused by reference or array transistor or from I-V slope mismatching. Selected memory cell 2282 is one of the memory cells in the array of memory cells.

Figure 24:
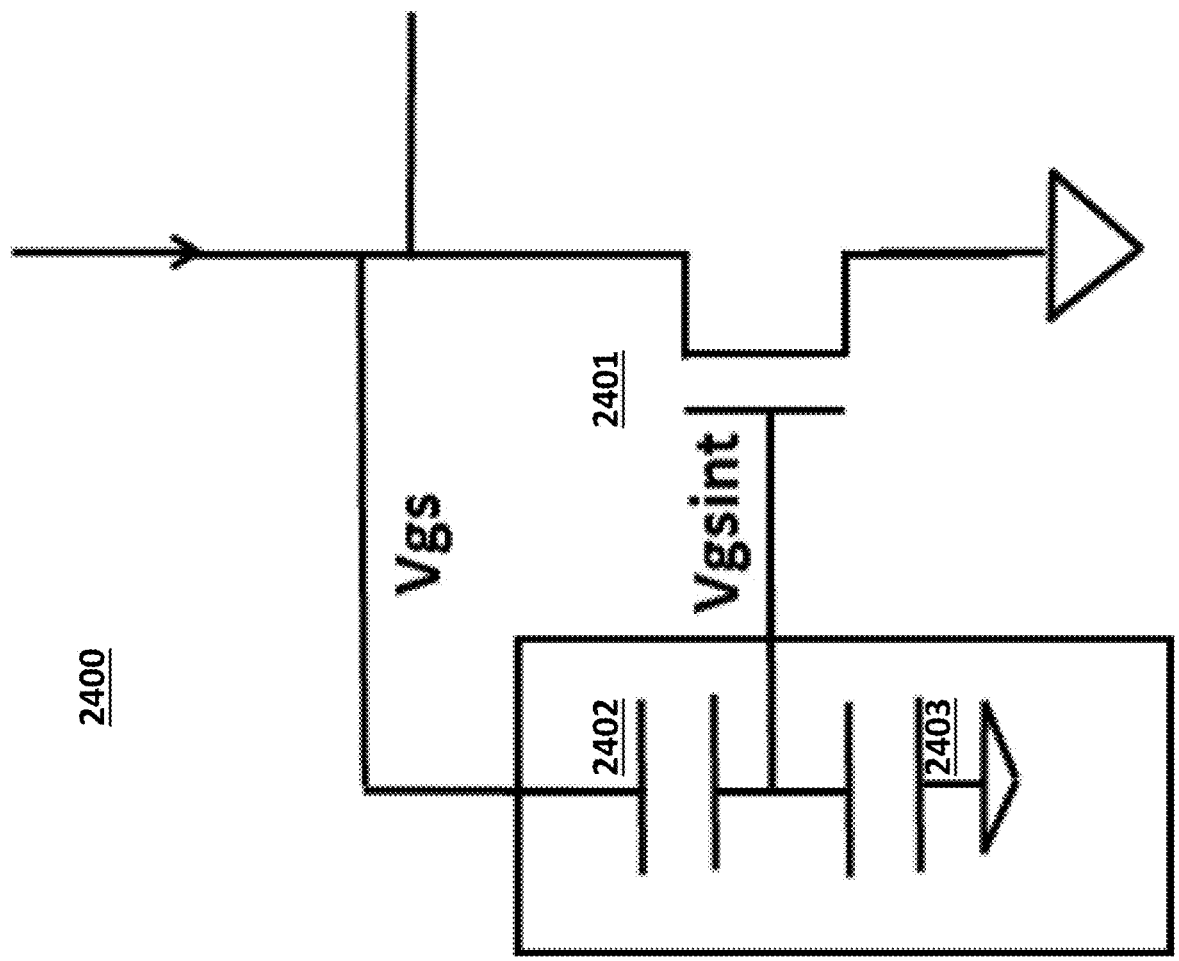
FIG. 24 depicts another embodiment of a slope compensation system.

FIG. 24 depicts slope normalization system 2400, comprising reference transistor 2401 and input adjustable capacitors 2402 and 2403. Adjustable capacitor 2402 receives input voltage Vgs. The ratio of adjustable capacitors 2402 and 2403 will affect voltage Vgsint, which is applied to the gate of reference transistor. Thus, the slope is altered by adjusting capacitors 2402 and 2403.

Figure 25:
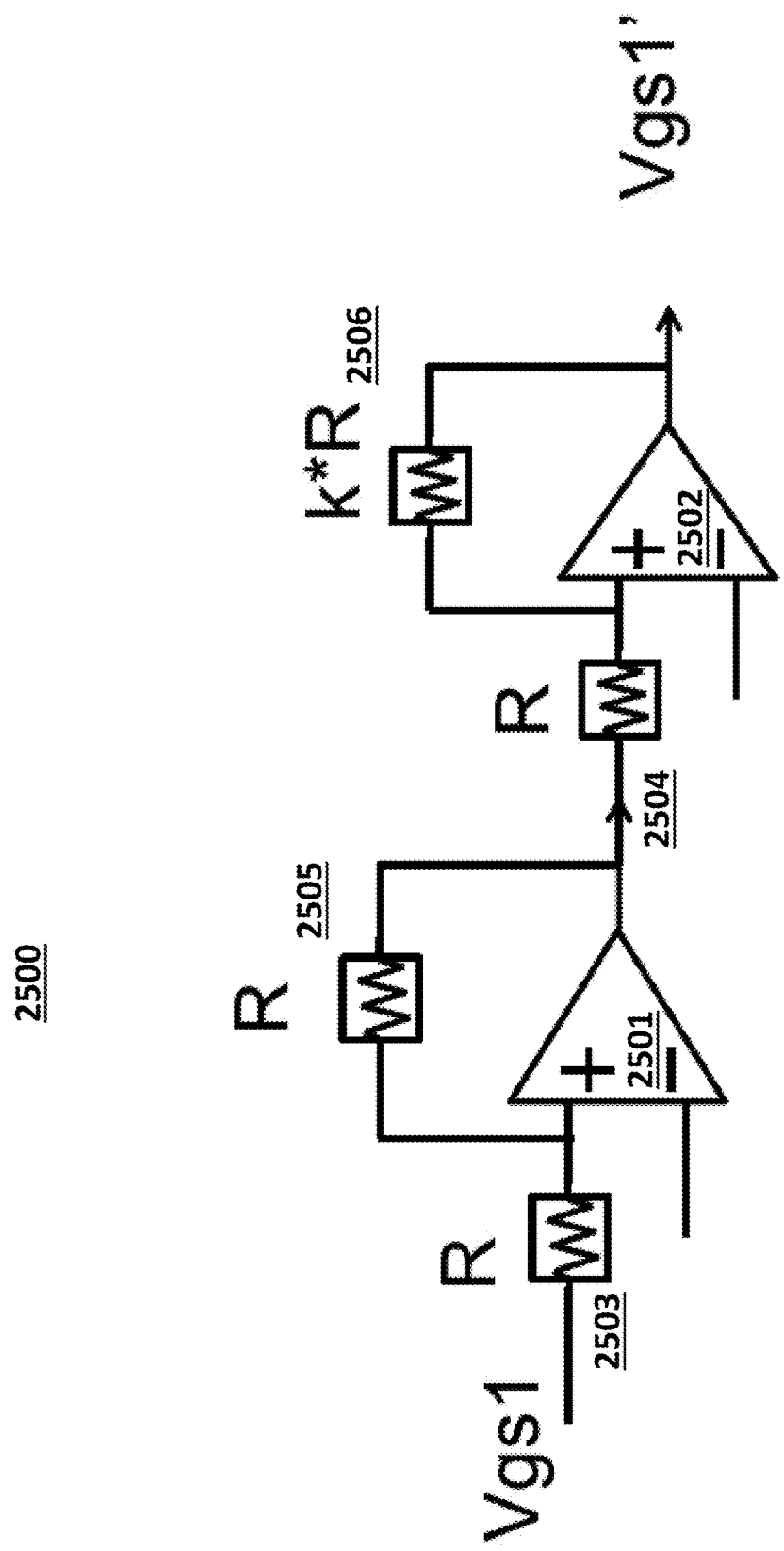
FIG. 25 depicts another embodiment of a slope compensation system.

FIG. 25 depicts slope normalization system 2500, comprising operational amplifiers 2501 and 2502, resistors 2503, 2504, and 2505, and variable resistor 2506. Slope normalization system 2500 receives an input voltage Vgs1 and outputs an output voltage Vgs1', which is adjusted by variable resistor 2506.

Figure 26:
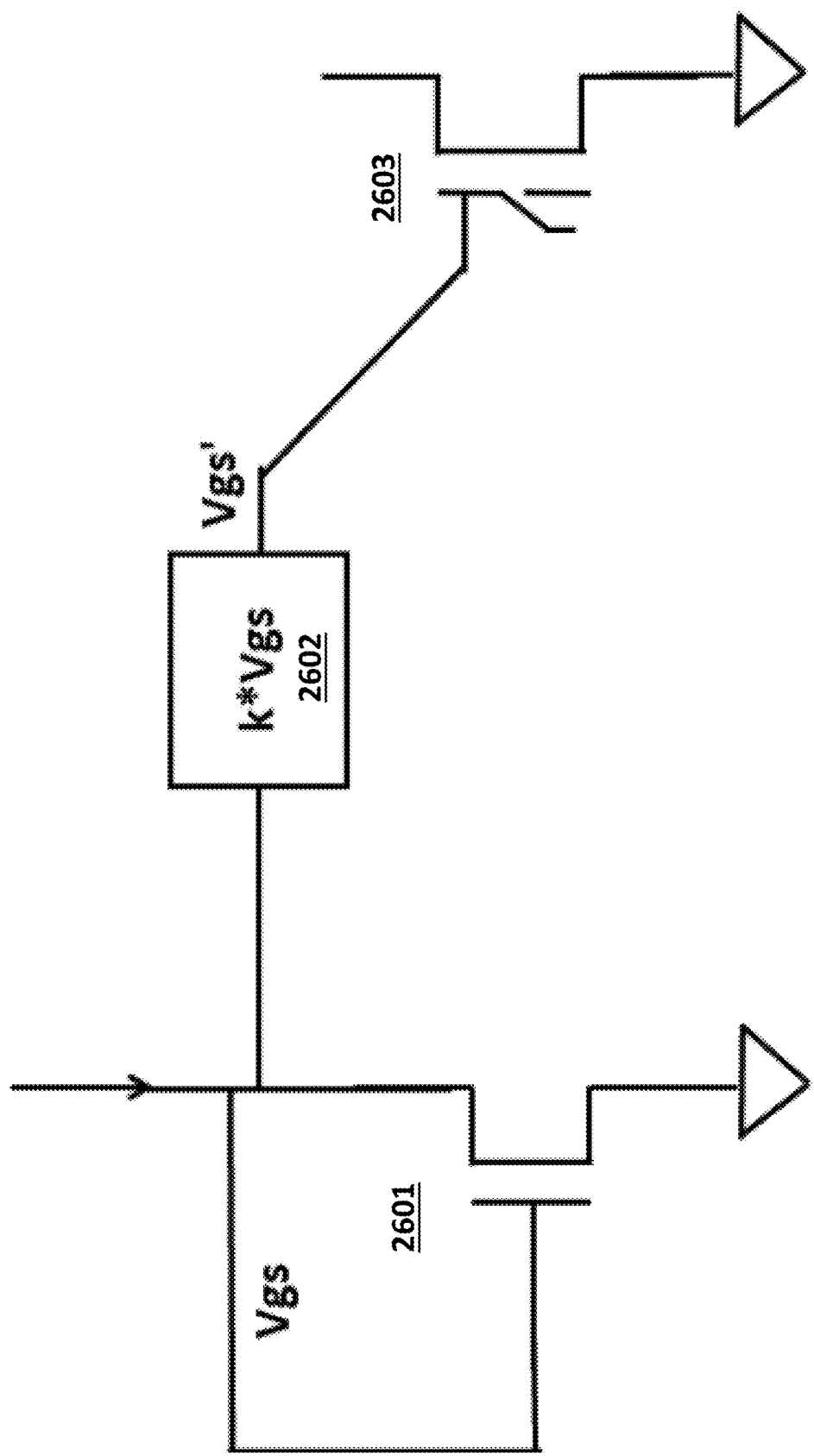
FIG. 26 depicts another embodiment of a slope compensation system.

FIG. 26 depicts slope normalization system 2600, comprising reference transistor 2601, selected memory cell 2603, and driver 2602. Driver 2602 receives voltage Vgs and multiplies it by k, resulting in an output voltage of Vgs'. Thus, reference transistor 2601 and selected memory cell 2603 will receive different voltages, where the difference accounts for the difference in slope.

Figure 27:
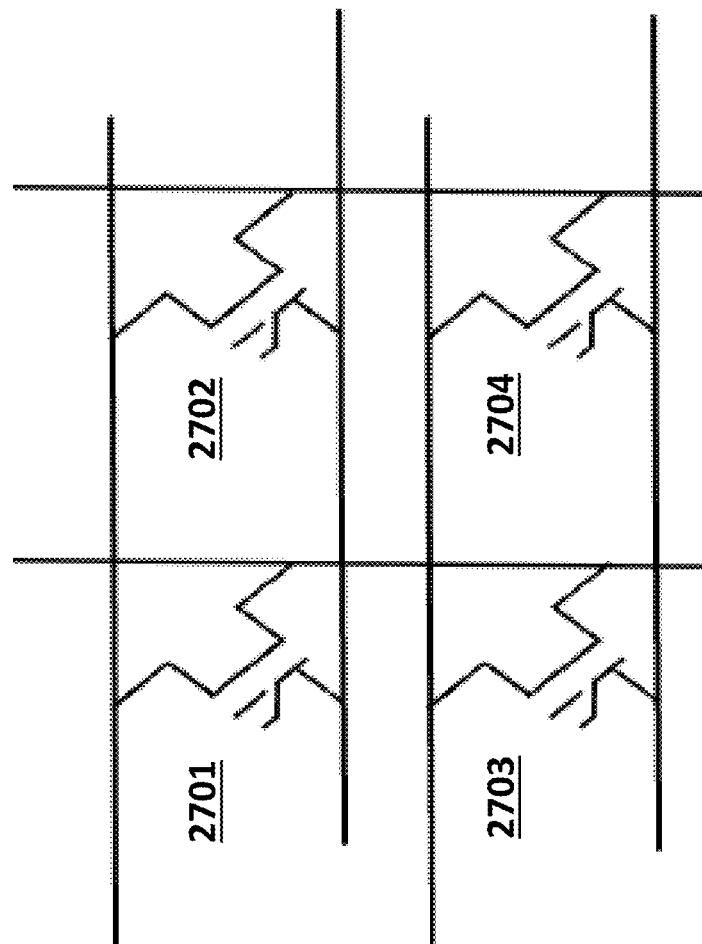
FIG. 27 depicts an embodiment of a memory cell array.

FIG. 27 depicts array 2700 of memory cells such as exemplary memory cells 2701, 2702, 2703, and 2704. The memory cells are connected in a configuration that allows for compensation to be made to the slope of the linear current-voltage reference curves for the memory cells.

Here, the current through a particular selected memory cell (such as memory cell 2701, 2702, 2703, or 2704) will be:

$$Ids=\beta*(Vgs-Vt)*Vds$$

Thus, one could multiply either Vgs or Vds by k to compensate.

Figure 28:
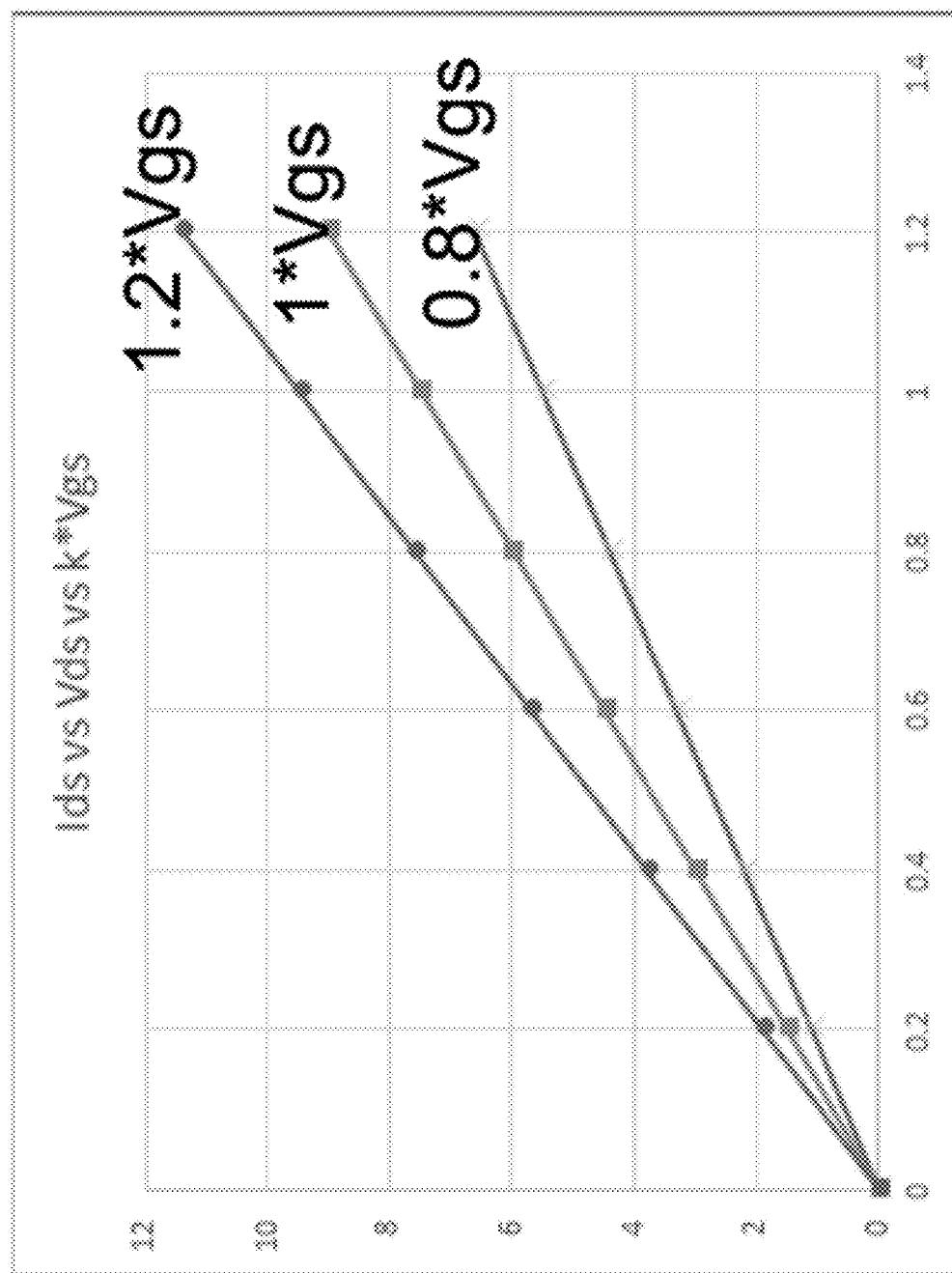
FIG. 28 depicts current-voltage characteristic curves of various slope-compensated systems.

FIG. 28 depicts exemplary current-voltage characteristic curves 2800 (Ids v. Vds) based on difference values of k.

Figure 29:
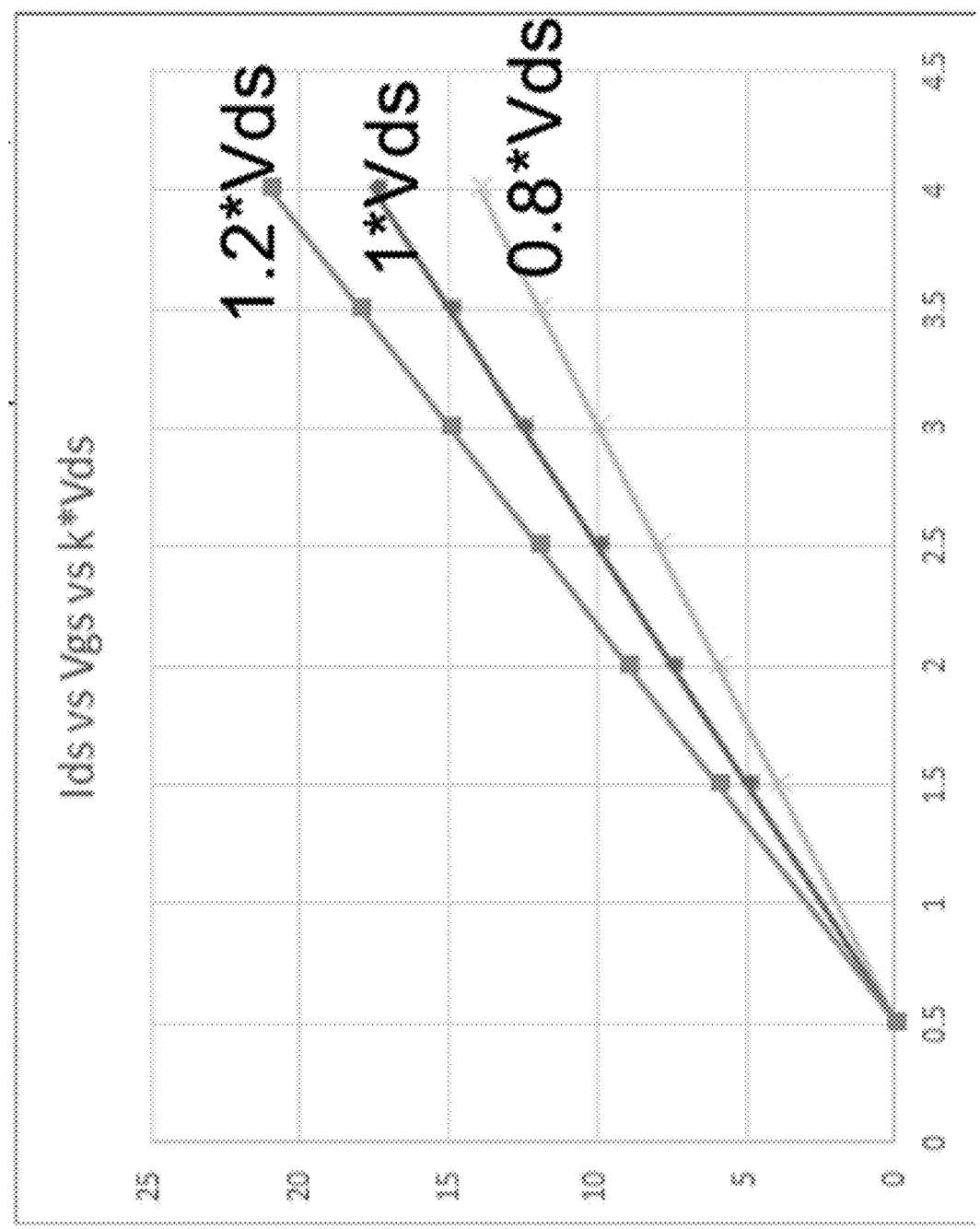
FIG. 29 depicts current-voltage characteristic curves of various slope-compensated systems.

FIG. 29 depicts exemplary current-voltage characteristic curves 2800 (Ids v. Vgs) based on difference values of k.

Figure 30:
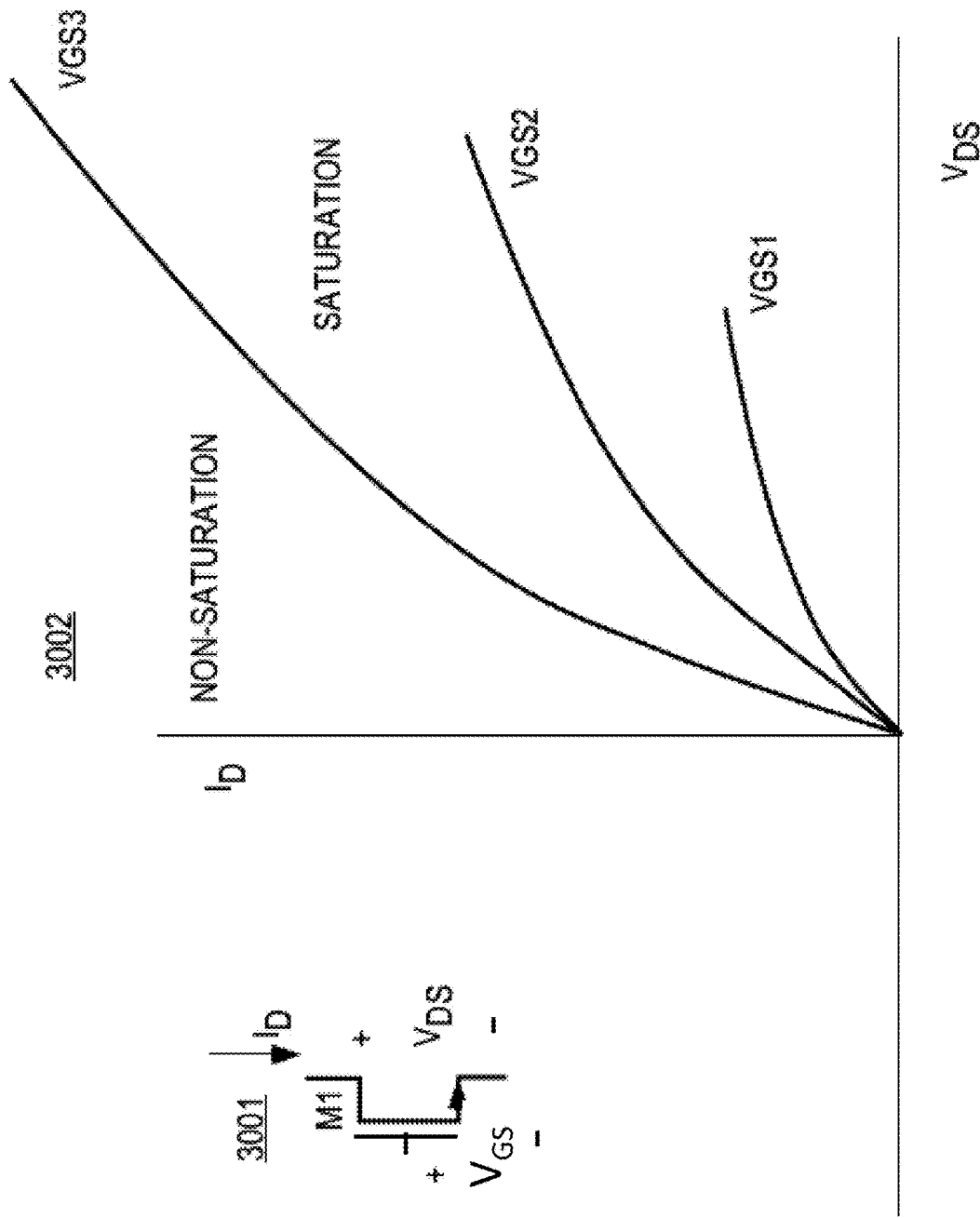
FIG. 30 depicts an exemplary reference transistor and its current-voltage characteristic curve.

FIG. 30 depicts an exemplary current-voltage characteristic curve 3002 of a reference transistor 3001. It can be appreciated that the ideal value of k can be determined so that the slope of the curves in FIG. 28 or 29 approximates the slop of the curve in FIG. 30.

Figure 31:
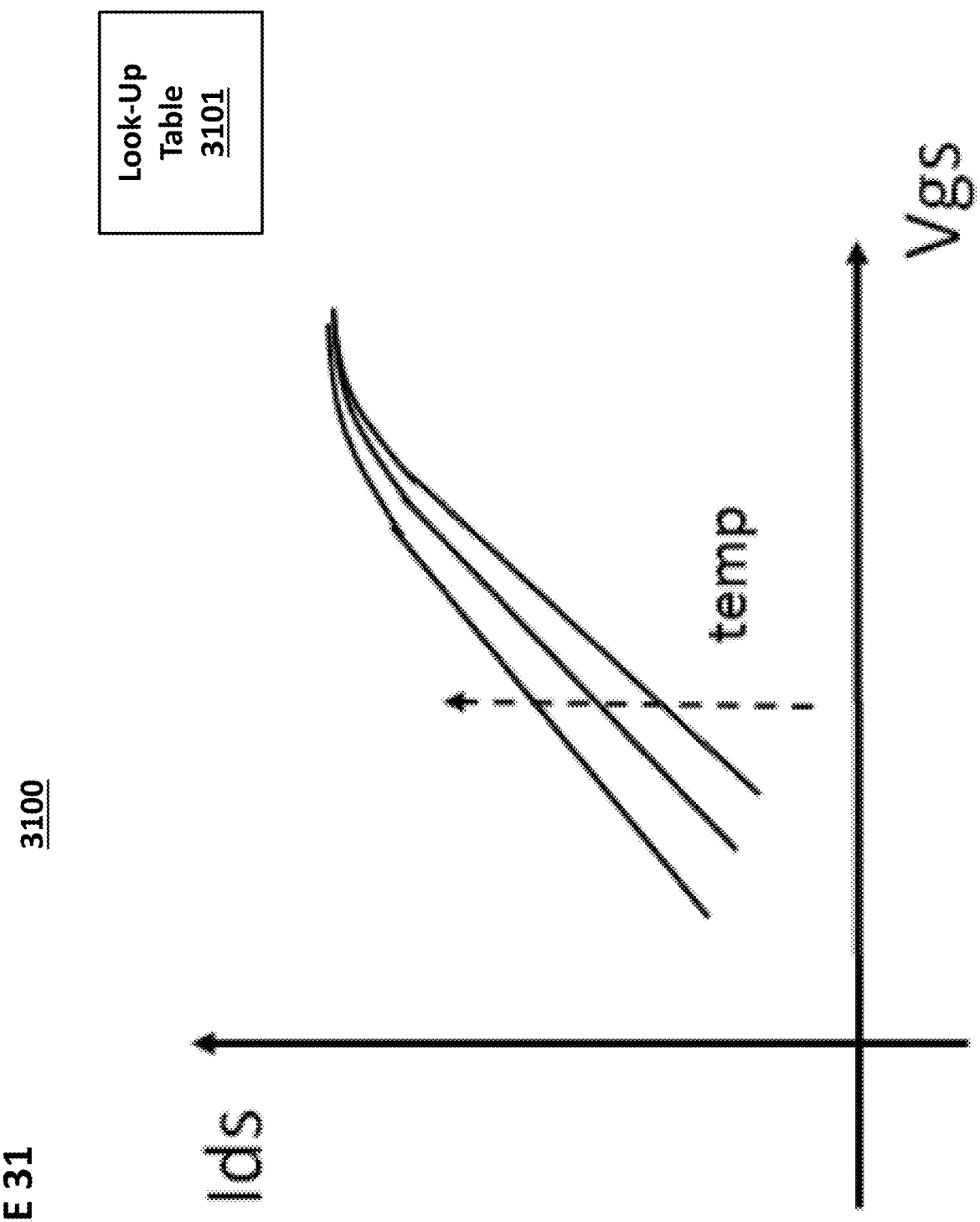
FIG. 31 depicts data stored in a look-up table to be used for compensating for slope differences.

FIG. 31 depicts exemplary current-voltage characteristic curves 3100 of transistor, reference memory cell, or selected memory cell as operating temperature of the device changes. In this embodiment, the date of curves 3100 is stored in look-up table 3101, and during operation, k is determined from look-up table 3101 rather than through mathematical formulas. Look-up table 3101 can contain different desired output currents for each input voltage at various operating temperatures. This data can be populated in look-up table 3101 during the manufacturing or testing process. The reference memory cell and selected memory cell optionally are non-volatile flash memory cells.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A method comprising:
   receiving an input voltage;
   multiplying the input voltage by a coefficient to generate an output voltage;
   applying the output voltage to a gate of a selected memory cell; and
   performing a sense operation using the selected memory cell and a reference device to determine a value stored in the selected memory cell;
   wherein a slope of a current-voltage characteristic curve of the reference device and a slope of the current-voltage characteristic curve of the selected memory cell are approximately equal during the sense operation.

2. The method of claim 1, wherein the reference device is a transistor.

3. The method of claim 1, wherein the reference device is a memory cell.

4. The method of claim 1, wherein the multiplying is performed by a driver circuit coupled to the gate of the selected memory cell.

5. A system comprising:
   a reference device;
   an array of memory cells comprising a selected memory cell; and
   a compensation circuit, coupled to the reference device, to cause a slope of a current-voltage characteristic curve of the reference device and a slope of a current-voltage characteristic curve of the selected memory cell to be approximately equal during a sense operation to determine a value stored in the selected memory cell.

6. The system of claim 5, wherein the reference device is a reference transistor.

7. The system of claim 6, wherein the compensation circuit comprises a driver circuit coupled to a gate of the reference transistor.

8. The system of claim 6, wherein the compensation circuit comprises a pair of input capacitors coupled to a gate of the reference transistor.

9. The system of claim 6, wherein the compensation circuit comprises a pair of operational amplifiers coupled to a gate of the reference transistor.

10. The system of claim 6, wherein the array is used in a vector-by-matrix multiplication array in a long short term memory system.

11. The system of claim 6, wherein the array is used in a vector-by-matrix multiplication array in a gated recurrent unit system.

12. The system of claim 5, wherein the reference device is a reference cell.

13. The system of claim 12, wherein the compensation circuit comprises a driver circuit coupled to a gate of the reference cell.

14. The system of claim 12, wherein the compensation circuit comprises a pair of input capacitors coupled to a gate of the reference cell.

15. The system of claim 12, wherein the compensation circuit comprises a pair of operational amplifiers coupled to a gate of the reference cell.

16. The system of claim 12, wherein the array is used in a vector-by-matrix multiplication array in a long short term memory system.

17. The system of claim 12, wherein the array is used in a vector-by-matrix multiplication array in a gated recurrent unit system.

18. The system of claim 5, further comprising:
    a reference look-up table;
    wherein the compensation circuit generates a voltage using the reference look-up table and applies the voltage to a gate of the selected memory cell.

19. The system of claim 18, wherein the look-up table comprises data derived from current-voltage characteristic curves based on different operating temperatures of a reference transistor.

20. The system of claim 18, wherein the memory cell is non-volatile.

21. The system of claim 18, wherein the array is used in a vector-by-matrix multiplication array in a long short term memory system.

22. The system of claim 18, wherein the array is used in a vector-by-matrix multiplication array in a gated recurrent unit system.

* * * * *